(12) United States Patent
Kasai et al.

(10) Patent No.: US 9,318,196 B1
(45) Date of Patent: Apr. 19, 2016

(54) NON-VOLATILE SEMICONDUCTOR MEMORY DEVICE

(71) Applicant: Floadia Corporation, Kondaira-shi, Tokyo (JP)

(72) Inventors: Hideo Kasai, Kodaira (JP); Yutaka Shinagawa, Kodaira (JP); Ryotaro Sakurai, Kodaira (JP); Yasuhiro Taniguchi, Kodaira (JP); Kosuke Okuyama, Kodaira (JP)

(73) Assignee: FLOADIA CORPORATION, Tokyo (JP)

( * ) Notice: Subject to any disclaimer, the term of this patent is extended or adjusted under 35 U.S.C. 154(b) by 0 days.

(21) Appl. No.: 14/725,740

(22) Filed: May 29, 2015

(51) Int. Cl.
| | | |
|---|---|---|
| G11C 16/04 | (2006.01) |
| G11C 14/00 | (2006.01) |
| G11C 11/417 | (2006.01) |
| H01L 29/423 | (2006.01) |
| G11C 11/419 | (2006.01) |
| G11C 16/24 | (2006.01) |

(52) U.S. Cl.
CPC .......... *G11C 14/0063* (2013.01); *G11C 11/417* (2013.01); *G11C 11/419* (2013.01); *G11C 16/0408* (2013.01); *G11C 16/24* (2013.01); *H01L 29/42364* (2013.01)

(58) Field of Classification Search
CPC ....................................................... G11C 16/14
USPC ........................................ 365/185.01–185.33
See application file for complete search history.

(56) References Cited

U.S. PATENT DOCUMENTS

| | | | | |
|---|---|---|---|---|
| 2006/0158926 A1* | 7/2006 | Yokoyama | .......... | H01L 27/1104 365/154 |
| 2010/0038625 A1* | 2/2010 | Bertin | ..................... | B82Y 10/00 257/9 |
| 2010/0039138 A1* | 2/2010 | Bertin | ..................... | B82Y 10/00 326/38 |
| 2010/0072459 A1* | 3/2010 | Bertin | ..................... | B82Y 10/00 257/24 |
| 2010/0078723 A1* | 4/2010 | Bertin | ..................... | B82Y 10/00 257/350 |

OTHER PUBLICATIONS

Wikipedia Encyclopedia; "Static Random Access Memory"; http://en.wikipedia.org/wiki/Static_random-access_memory; Dated May 5, 2015.

* cited by examiner

*Primary Examiner* — Harry W Byrne
(74) *Attorney, Agent, or Firm* — Pearne & Gordon LLP

(57) ABSTRACT

In a non-volatile semiconductor memory device capable of programming SRAM data in an SRAM into a non-volatile memory unit while implementing a high-speed operation in the SRAM, a voltage required to program the SRAM data into the non-volatile memory unit can be lowered. Thus, the SRAM can be operated at high speed with a low power supply voltage because the thickness of a gate insulating film of each of a first access transistor, a second access transistor, a first load transistor, a second load transistor, a first drive transistor, and a second drive transistor constituting the SRAM connected to the non-volatile memory unit can be set to 4 [nm] or less. Therefore, the SRAM data in the SRAM can be programmed into the non-volatile memory unit while a high-speed operation in the SRAM can be implemented.

15 Claims, 22 Drawing Sheets

| | CASE OF SRAM DATA "0" | | NON-VOLATILE MEMORY UNIT | |
|---|---|---|---|---|
| | SNT | SNB | FIRST MEMORY TRANSISTOR | SECOND MEMORY TRANSISTOR |
| INITIAL STATE OF SRAM | 0V <DATA = 0> | VDD <DATA = 1> | | |
| ERASE MEMORY DATA IN NON-VOLATILE MEMORY UNIT | | | Vth<0 | Vth<0 |
| PROGRAM SRAM DATA INTO NON-VOLATILE MEMORY UNIT | | | Vth>0 <DATA = 0> (WRITING STATE BECAUSE SNT = 0 V) | Vth<0 <DATA = 1> (NON-WRITING STATE) |
| WRITE MEMORY DATA INTO SRAM | 0V <DATA = 0> | VDD <DATA = 1> | | |

|  | MG1 | CGT1 | CGB1 | MS1 | SNT/SNB | WL1 |
|---|---|---|---|---|---|---|
| Program(sram to flash) | 7 | VDD | VDD | 6 | 0 or VDD | 0 |
| Erase(reset data in flash) | -7 | 0 | 0 | 6 | Don't care | 0 |
| Write(external data to sram) | Don't care | 0 | 0 | Don't care | 0 or VDD | VDD/0 |
| Read(output sram data) | Don't care | 0 | 0 | Don't care | 0 or VDD | VDD/0 |

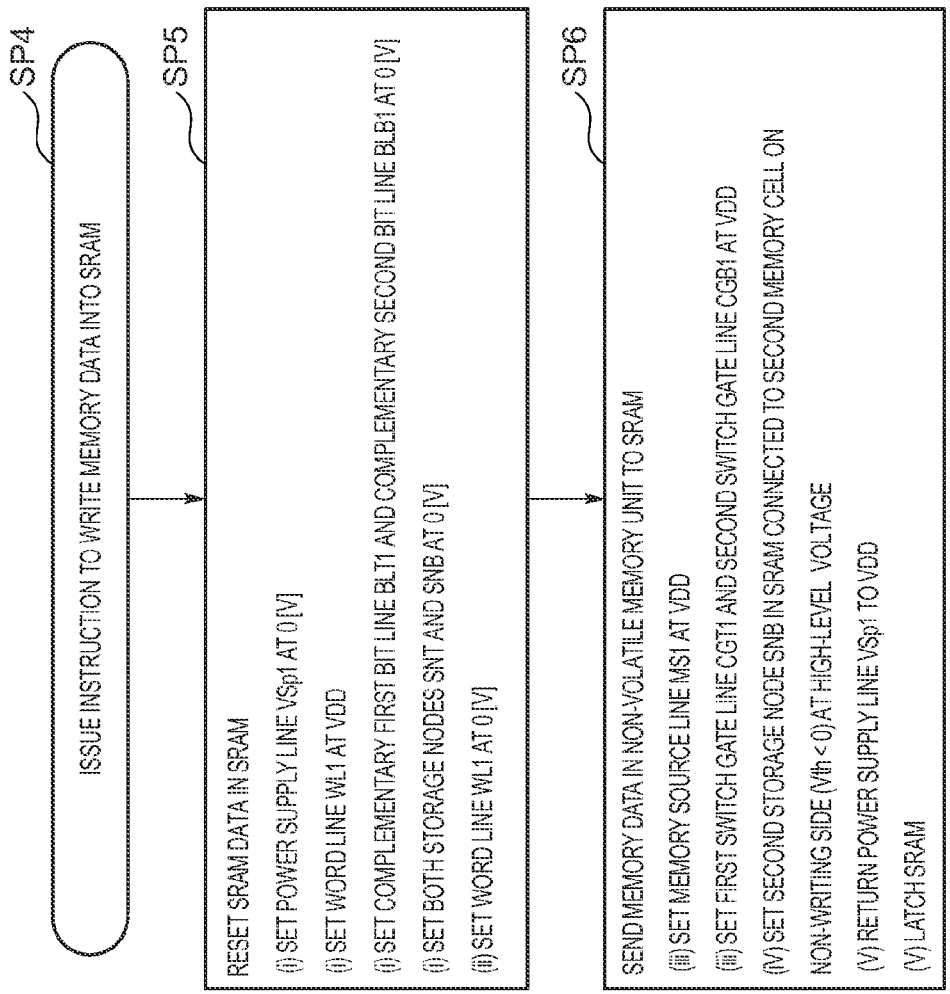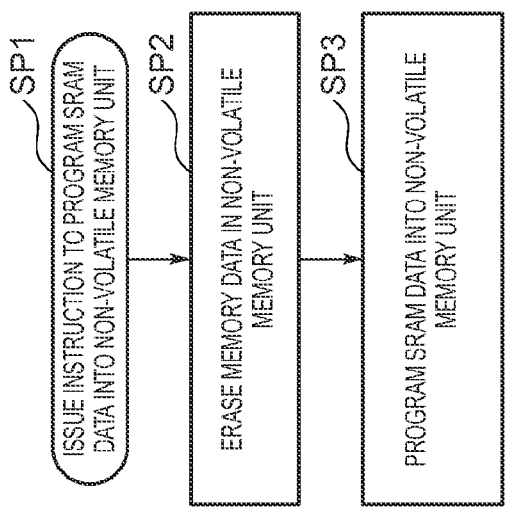

Fig.6A

|  | CASE OF SRAM DATA "0" | | NON-VOLATILE MEMORY UNIT | |
|---|---|---|---|---|
|  | SNT | SNB | FIRST MEMORY TRANSISTOR | SECOND MEMORY TRANSISTOR |
| INITIAL STATE OF SRAM | 0V <DATA = 0> | VDD <DATA = 1> | | |
| ERASE MEMORY DATA IN NON-VOLATILE MEMORY UNIT | | | Vth<0 | Vth<0 |
| PROGRAM SRAM DATA INTO NON-VOLATILE MEMORY UNIT | | | Vth>0 <DATA = 0> (WRITING STATE BECAUSE SNT = 0 V) | Vth<0 <DATA = 1> (NON-WRITING STATE) |
| WRITE MEMORY DATA INTO SRAM | 0V <DATA = 0> | VDD <DATA = 1> | | |

Fig.6B

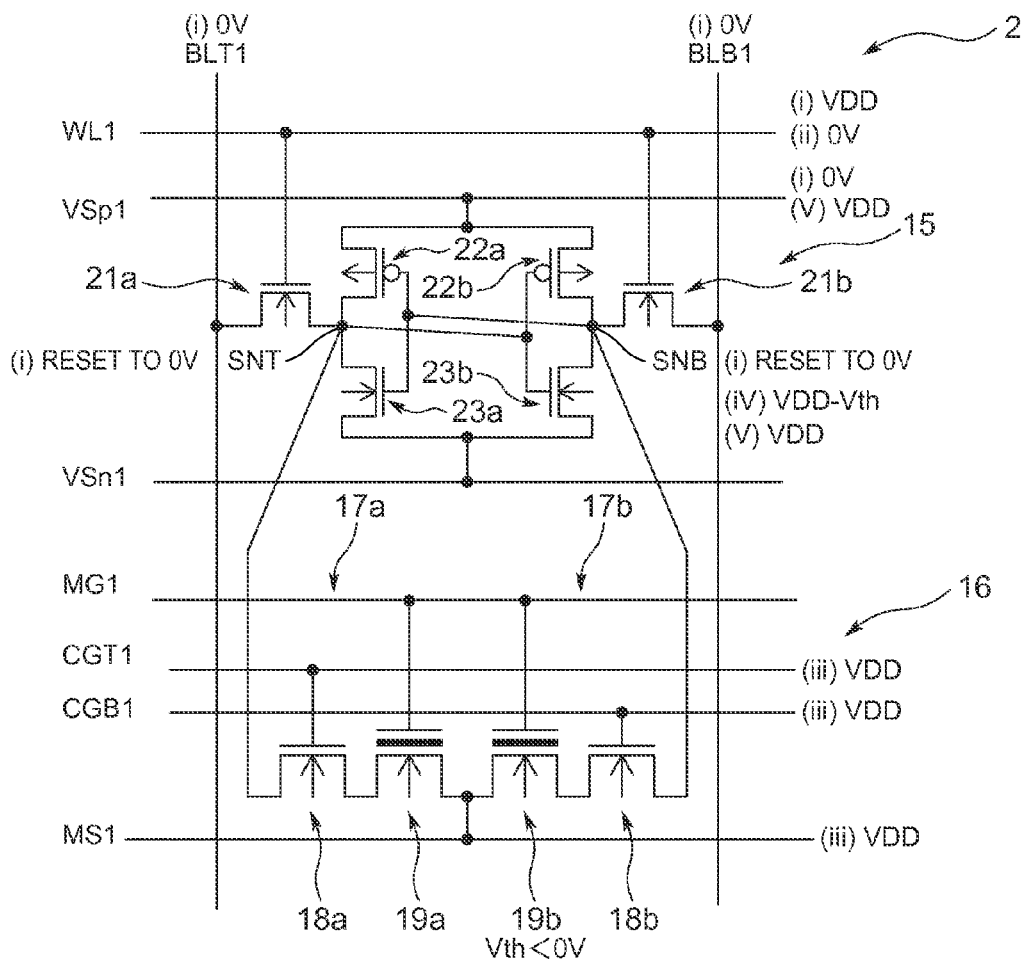

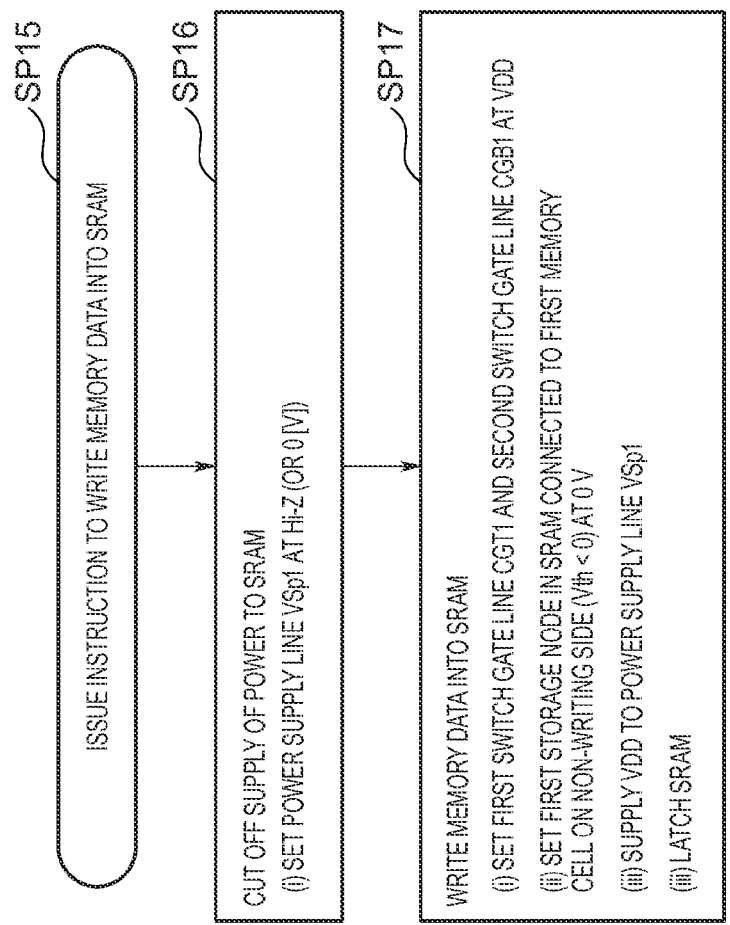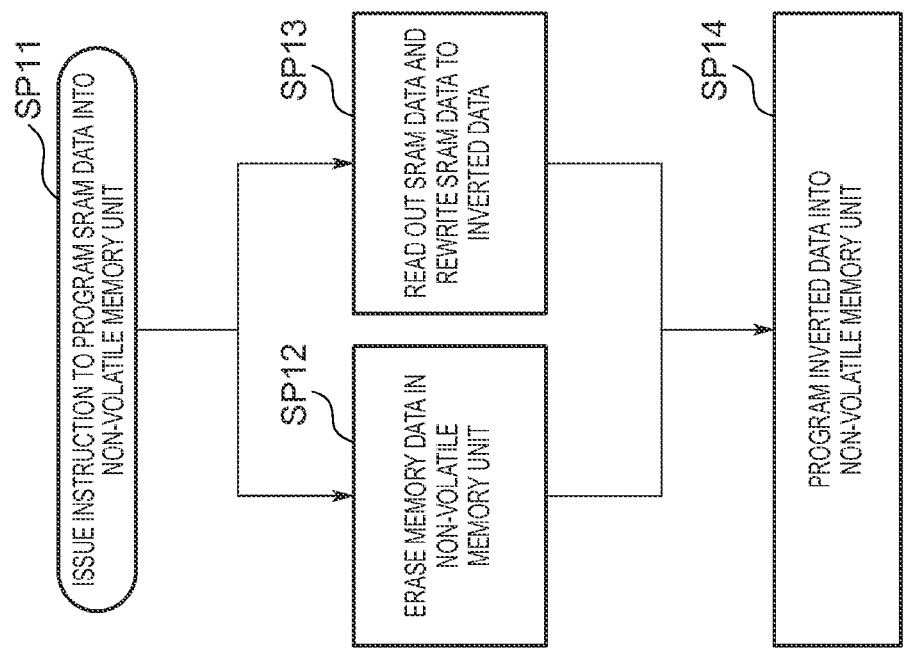

Fig.8A

|  | CASE OF SRAM DATA "0" | | NON-VOLATILE MEMORY UNIT | |
| --- | --- | --- | --- | --- |
|  | SNT | SNB | FIRST MEMORY TRANSISTOR | SECOND MEMORY TRANSISTOR |
| INITIAL STATE OF SRAM | 0V <DATA = 0> | VDD <DATA = 1> |  |  |
| ERASE MEMORY DATA IN NON-VOLATILE MEMORY UNIT |  |  | Vth＜0 | Vth＜0 |
| INVERT SRAM DATA | VDD <DATA = 1> | 0V <DATA = 0> |  |  |
| PROGRAM SRAM DATA INTO NON-VOLATILE MEMORY UNIT |  |  | Vth＜0 <DATA = 1> (NON-WRITING STATE) | Vth＞0 <DATA = 0> (WRITING STATE BECAUSE SNT = 0V) |
| WRITE MEMORY DATA INTO SRAM | 0V <DATA = 0> | VDD <DATA = 1> |  |  |

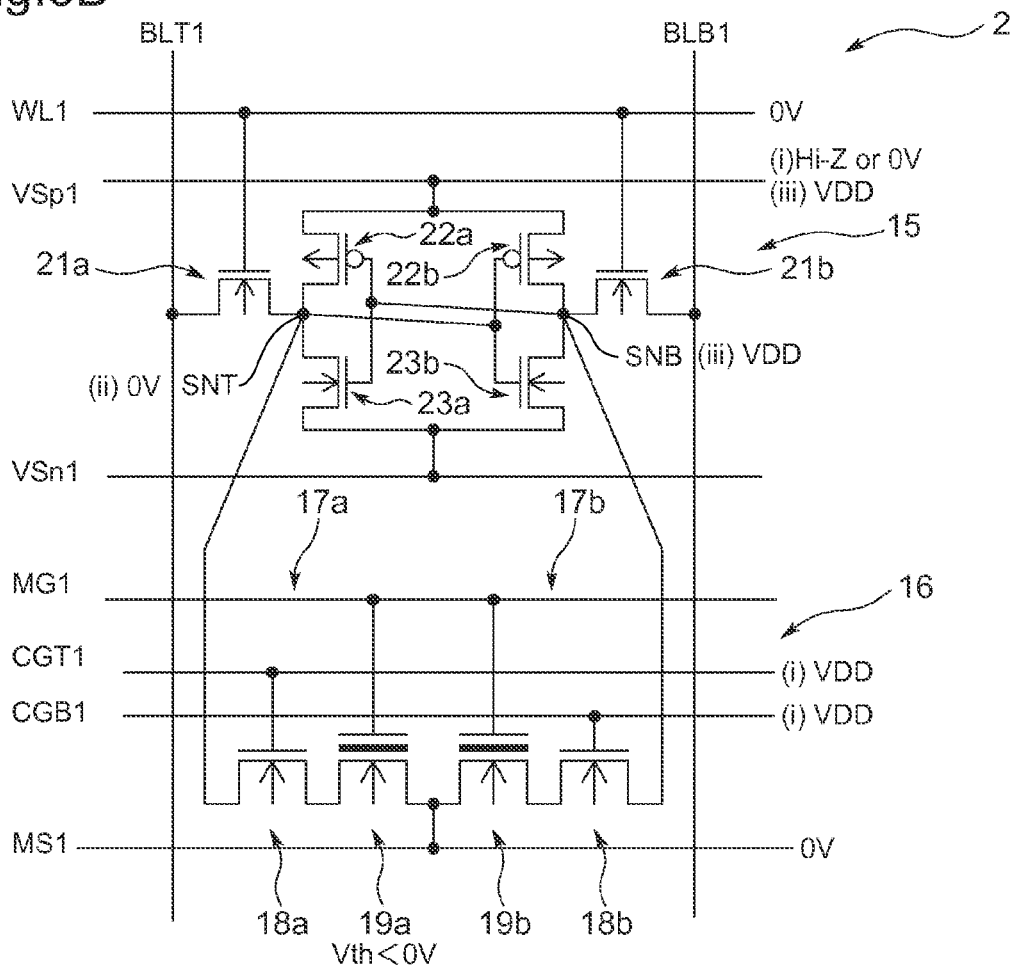

Fig.8B

|  | MG1 | CGT1 | CGB1 | MS1 | SNT/SNB | WL1 | EG1 |
|---|---|---|---|---|---|---|---|
| Program(sram to flash) | 10 | VDD | VDD | 6 | 0 or VDD | 0 | 6 |
| Erase(reset data in flash) | 0 | 0 | 0 | 0 | Don't care | 0 | 12 |
| Write(external data to sram) | Don't care | 0 | 0 | Don't care | 0 or VDD | VDD/0 | 0 |
| Read(output sram data) | Don't care | 0 | 0 | Don't care | 0 or VDD | VDD/0 | 0 |

|  | CGT1 | CGB1 | MS1 | SNT/SNB | WL1 |
|---|---|---|---|---|---|
| Program(sram to flash) | VDD | VDD | 10 | 0 or VDD | 0 |
| Erase(reset data in flash) | 12 | 12 | 0 | Don't care | 0 |

| | CGT1 | CGB1 | MS1 | SNT/SNB | WL1 | E1 |
|---|---|---|---|---|---|---|
| Program(sram to flash) | VDD | VDD | 10 | 0 or VDD | 0 | 0 |
| Erase(reset data in flash) | 0 | 0 | 0 | Don't care | 0 | 10 |

NON-VOLATILE SEMICONDUCTOR MEMORY DEVICE

FIELD OF THE INVENTION

The present invention relates to a non-volatile semiconductor memory device, and is appropriately applied to a non-volatile semiconductor memory device including a static random access memory (SRAM), for example.

BACKGROUND OF THE INVENTION

In recent years, as electrical devices such as smartphones have spread, an SRAM for processing a large-capacity signal such as an audio signal or an image signal at high speed has increased in importance (see, e.g., "Wikipedia. Static Random. Access Memory", Internet (URL: http://ja.wikipedia.org/wiki/Static_Random_Access_Memory)).

Generally, in the SRAM, a higher speed, a smaller area, and lower power are important. In recent years, a new circuit configuration has also been developed. The SRAM is a volatile memory. Thus, external data written into a storage node desirably remains stored even after the supply of power is stopped, SRAM data is also desirably programmed into a non-volatile memory unit capable of storing data even after the power is stopped or desirably read out again into the storage node from the non-volatile memory unit after the power is turned on again.

However, in a general non-volatile memory unit, a voltage difference between a voltage value required during a programming operation for programming data and a voltage value required during a non-programming operation for not programming data is large. Therefore, a high-speed operation in an SRAM is difficult to implement because a voltage applied to the SRAM, which exchanges data with such a conventional non-volatile memory unit, also increases to match voltages required for the programming operation and the non-programming operation of data into the non-volatile memory unit, and thus the thickness of a gate insulating film of a transistor constituting the SRAM also increases.

SUMMARY OF THE INVENTION

The present invention is made with the above points in mind, and is directed to providing a non-volatile semiconductor memory device capable of programming SRAM data in an SRAM into a non-volatile memory unit while implementing a high-speed operation in the SRAM.

To solve such an issue, a non-volatile semiconductor memory device according to an aspect of the present invention comprises a non-volatile static random access memory (SRAM) memory cell including an SRAM including a first load transistor and a first drive transistor having their respective one ends connected to each other, a first storage node being provided between the first load transistor and the first drive transistor, a second load transistor and a second drive transistor having their respective one ends connected to each other, a second storage node being provided between the second load transistor and the second drive transistor, a power supply line being connected to respective other ends of the first load transistor and the second load transistor, and a reference voltage line being connected to respective other ends of the first drive transistor and the second drive transistor, and a nonvolatile memory unit including a first memory cell having a first memory transistor and a first switch transistor connected in series with the first memory transistor in which a voltage is applied to one and of the first switch transistor from one of the first storage node and the second storage node and a second memory cell having a second memory transistor and a second switch transistor connected in series with the second memory transistor in which a voltage, is applied to one end of the second switch transistor from the other one of the second storage node and the first storage node, the SRAM further includes a first access transistor having one end connected to respective gates of the second load transistor and the second drive transistor' and the first storage node, the other end connected to a complementary first bit line, and a gate connected to a word line, and a second access transistor having one and connected to respective gates of the first load transistor and the first drive transistor and the second storage node, the other end connected to a complementary second bit line, and a gate connected to the word line, and a thickness of a gate insulating film of each of the first access transistor, the second access transistor, the first load transistor, the second load transistor, the first drive transistor, and the second drive transistor is set to 4 [nm] or less.

In the non-volatile semiconductor memory device having such a configuration, when the SRAM data represented by a difference between respective voltages at the first storage node and the second storage node in the SRAM is programmed into the non-volatile memory unit, either one of the first switch transistor and the second switch transistor is turned on due to the difference between the voltages at the first storage node and the second storage node, and charge can be injected into a charge storage region of the first memory transistor or the second memory transistor using source side injection in which charge accelerated with a voltage and charge secondarily generated is injected either between the first switch transistor and the first memory transistor, which have been turned on, or between the second switch transistor and the second memory transistor, which have been turned on.

According to the aspect of the present invention, the SRAM data can be programmed using source side injection in the non-volatile memory unit, and a voltage required during a programming operation for programming data into the non-volatile memory unit or during a programming inhibition operation for not programming data into the non-volatile memory unit can be lowered. Thus, the SRAM can be operated at high speed with a low power supply voltage because the thickness of the gate insulating film of each of the first access transistor, the second access transistor, the first load transistor, the second load transistor, the first drive transistor, and the second drive transistor constituting the SRAM connected to the non-volatile memory unit can be set to 4 [nm] or less. Therefore, the SRAM data in the SRAM can be programmed into the non-volatile memory unit while a high-speed operation in the SRAM can be implemented.

BRIEF DESCRIPTION OF THE DRAWINGS

FIG. 5A is a flowchart illustrating a procedure for the programming operation for writing the SRAM data in the SRAM into the non-volatile memory unit, and FIG. 5B is a flowchart illustrating a procedure for a memory data writing operation for writing memory data in the non-volatile memory unit into the SRAM;

FIG. 6A is a table summarizing respective states of data in the SRAM and the non-volatile memory unit in the procedure for the programming operation and the procedure for the memory data writing operation, and FIG. 6B is a schematic view of the non-volatile SRAM memory cell provided for describing the procedure for the memory data writing operation illustrated in FIG. 5B;

FIG. 7A is a flowchart illustrating a procedure for a programming operation according to another embodiment, and FIG. 7B is a flowchart illustrating a procedure for a memory data writing operation according to the other embodiment;

FIG. 8A is a table summarizing respective states of data in an SRAM and a non-volatile memory unit in the procedure for the programming operation and the procedure for the memory data writing operation according to the other embodiment, and FIG. 8B is a schematic view of a non-volatile SRAM memory cell provided for describing the procedure for the memory data writing operation illustrated in FIG. 7E;

FIG. 19I is a table illustrating respective voltage values at each site during a programming operation, during a memory data erasing operation, during an external data writing operation, and during an SRAM data reading operation;

FIG. 20I is a table illustrating respective voltage values at each site during a programming operation and during a memory data erasing operation;

DETAILED DESCRIPTION

Embodiments of the present invention will be specifically described below with reference to the drawings.

(1) Entire Configuration of Non-Volatile Semiconductor Memory Device

Figure 1:
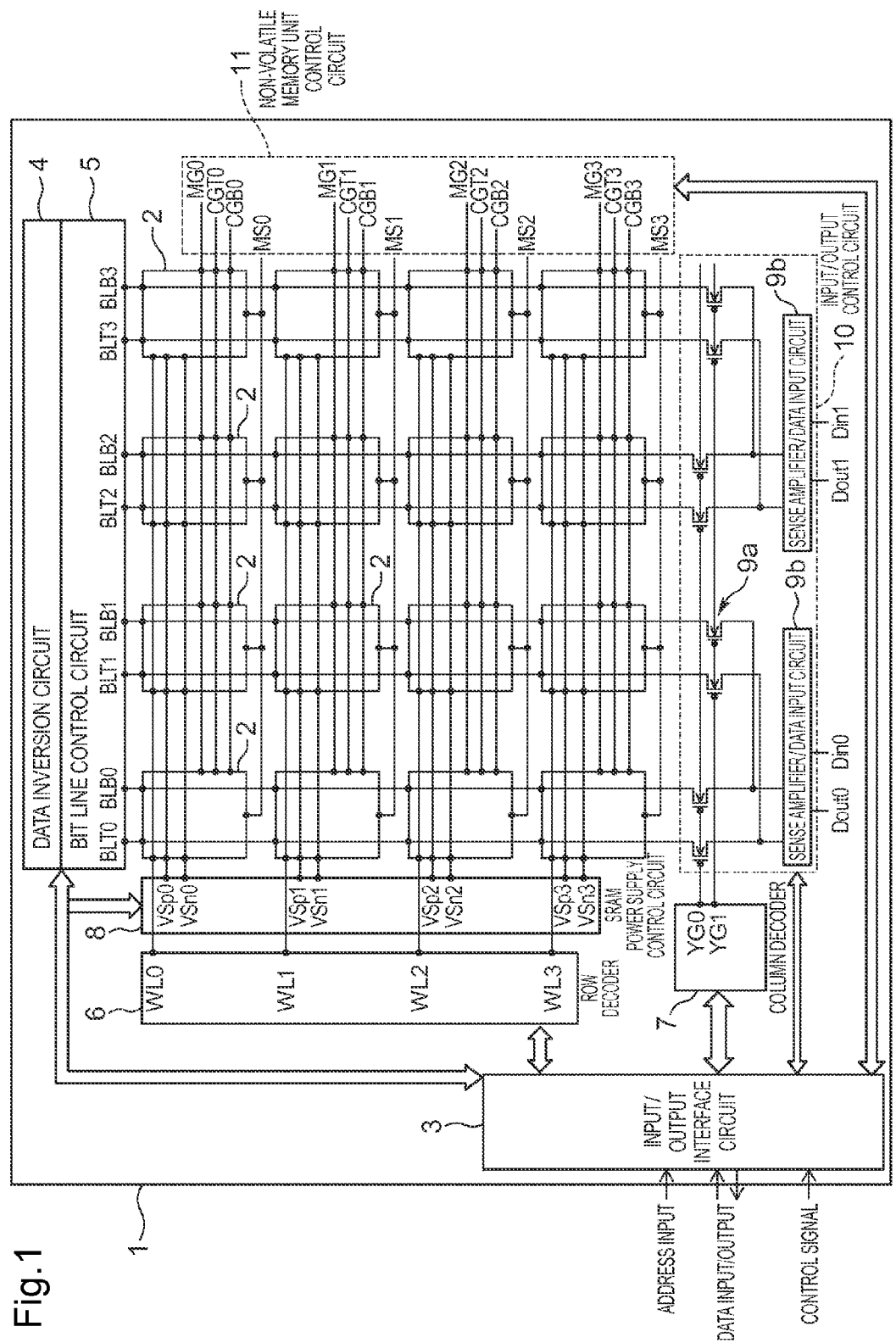
FIG. 1 is a schematic view illustrating a circuit configuration of a non-volatile semiconductor memory device according to an embodiment of the present invention.

In FIG. 1, a non-volatile semiconductor memory device 1 according to an embodiment of the present invention has a configuration in which a plurality of non-volatile SRAM memory cells 2 are arranged in a matrix shape. In the non-volatile semiconductor memory device 1, an address input, and a control signal can be input to an input/output interface circuit 3 while data can be input and output between the input/output interface circuit 3 and an external circuit. The input/output interface circuit 3 can generate a predetermined operation signal based on the address input, the data input, and the control signal, and can send out the operation signal to a data inversion circuit 4, a bit line control circuit 5, a row decoder 6, a column decoder 7, an SRAM power supply control circuit 8, an input/output control circuit 10, a non-volatile memory unit control circuit 11, as needed. Thus, the data inversion circuit 4, the bit line control circuit. 5, the row decoder 6, the column decoder 7, the SRAM power supply control circuit 8, the input/output, control circuit 10, and the non-volatile memory unit control unit 11 can respectively perform predetermined operations by being controlled in response to the operation signal from the input/output interface circuit 3.

In practice, a plurality of word lines WL0, WL1, WL2, and WL3 are provided in the row decoder 6, and the plurality of nonvolatile SRAM memory cells 2 are connected for each of the word lines WL0, WL1, WL2, and WL3. Thus, the row decoder 6 can apply a predetermined voltage to the non-volatile SRAM memory cells 2 for each of the word line WL0, WL1, WL2, and WL3 based on a row address included in the operation signal. The column decoder 7 is connected to the input/output control circuit 10 via wirings YG0 and YG1, and can turn on or off transistors 9a provided in the input/output control circuit 10.

In the input/output, control circuit 10, when the pair of transistors 9a provided for each column of non-volatile SRAM memory cells 2 is turned on or off, a sense amplifier/ data input circuit 9b can detect a reading bit voltage from the predetermined non-volatile SRAM memory cell 2 among non-volatile SRAM memory cells 2 arranged in a matrix shape. When the transistors 9a connected to a complementary first bit line BLT1 and a complementary second bit line BLB1, which are paired with each other, for example, are turned on, the sense amplifier/data input circuit 9b can detect a voltage difference between the complementary first bit line BLT1 and the complementary second bit line BLB1, and can determine the complementary first bit line BLT1 (or the complementary second bit line BLB1) having a higher voltage as High-level and determine the complementary second bit line BLB1 (or the complementary first bit line BLT1) having a lower voltage as Low-level.

A complementary first bit line BLT0 (BLT1, BLT2, BLT3) and a complementary second bit line BLB0 (BLB1, BLB2, BLB3), which are paired with each other, are connected to the bit line control circuit 5. The bit line control circuit 5 can apply a predetermined voltage to the non-volatile SRAM memory cells 2 by the column through the complementary first bit line BLT0 (BLT1, BLT2, BLT3) and the complementary second bit line BLB0 (BLB1, BLB2, BLB3).

In addition to such a configuration, in the non-volatile semiconductor memory device 1 according to the embodiment of the present invention, the data inversion circuit 4 is provided, and the complementary first bit line BLT0 (BLT1, BLT2, BLT3) and the complementary second bit line BLB0 (BLB1, BLB2, BLB3), which are paired with each other, are connected to the data inversion circuit 4. The data inversion circuit 4 reads out a High-level and a Low-level of an SRAM (will be described below referring to FIG. 2) constituting the non-volatile SRAM memory cell 2, logically inverts the High-level into a Low-level and the Low-level into a High-level, and writes the Low-level and the High-level into the SRAM as inverted data. Logical inversion processing of the SRAM by the data inversion circuit 4 will be specifically described in "(2-5-2) Memory Data Writing Operation According to Second Embodiment", described below.

While a case where the data inversion circuit 4 and the sense amplifier/data input circuit 9b are separately provided has been described in the present embodiment, the present invention is not limited to this. For example, the data inversion circuit. 4 may be arranged in the sense amplifier/data input circuit 9b, in which information about a High-level and Low-level of the non-volatile SRAM memory cell 2 is read out using a sense amplifier and then logically inverted to be written into the SRAM again as inverted data.

On the other hand, a plurality of power supply lines VSp0, VSp1, VSp2, and VSp3 and a plurality of reference voltage lines VSn0, VSn1, VSn2, and VSn3 are connected to the SRAM power supply control circuit 8, the power supply line VSp0 VSp2, VSp3) and the reference voltage line VSn0 (VSn1, VSn2, VSn3) are paired with each other, and the non-volatile SRAM memory cells 2 are connected to the power supply line VSp0 (VSp1, VSp2, VSp3) and the reference voltage line VSn0 (VSn1, VSn2, VSn3). Thus, the SRAM power supply control circuit 8 can uniformly apply a power supply voltage VDD to the non-volatile SRAM memory cells 2 for each of the power supply lines VSp0, VSp1, VSp2, and VSp3 by applying the power supply voltage VDD to the power supply lines VSp0, VSp1, VSp2, and VSp3. Also, with the reference voltage line VSn0 (VSn1, VSn2, VSn3), a voltage of 0 [V] can be uniformly applied to the non-volatile SRAM memory cells 2 for each of the reference voltage lines VSn0, VSn1, VSn2, and VSn3.

A plurality of memory gate lines MG0, MG1, MG2, and MG3, a plurality of memory source lines MS0, MS1, MS2, MS3, a plurality of first switch gate lines CGT0, CGT1, CGT2, and CGT3, and a plurality of second switch gate lines CGB0, CGB1, CGB2, and CGB3 are connected to the non-volatile memory unit control circuit 11. A predetermined voltage can be applied to the non-volatile SRAM memory cells 2 by the row through the memory gate line MG0 (MG1, MG2, MG3), the memory source line MS0 (MS1, MS2, MS3), the first switch gate line CGT0 (CGT1, CGT2, CGT3), and the second switch gate line CGB0 (CGB1, CGB2, CGB3).

(2) Configuration of Non-Volatile SRAM Memory Cell

Figure 2:
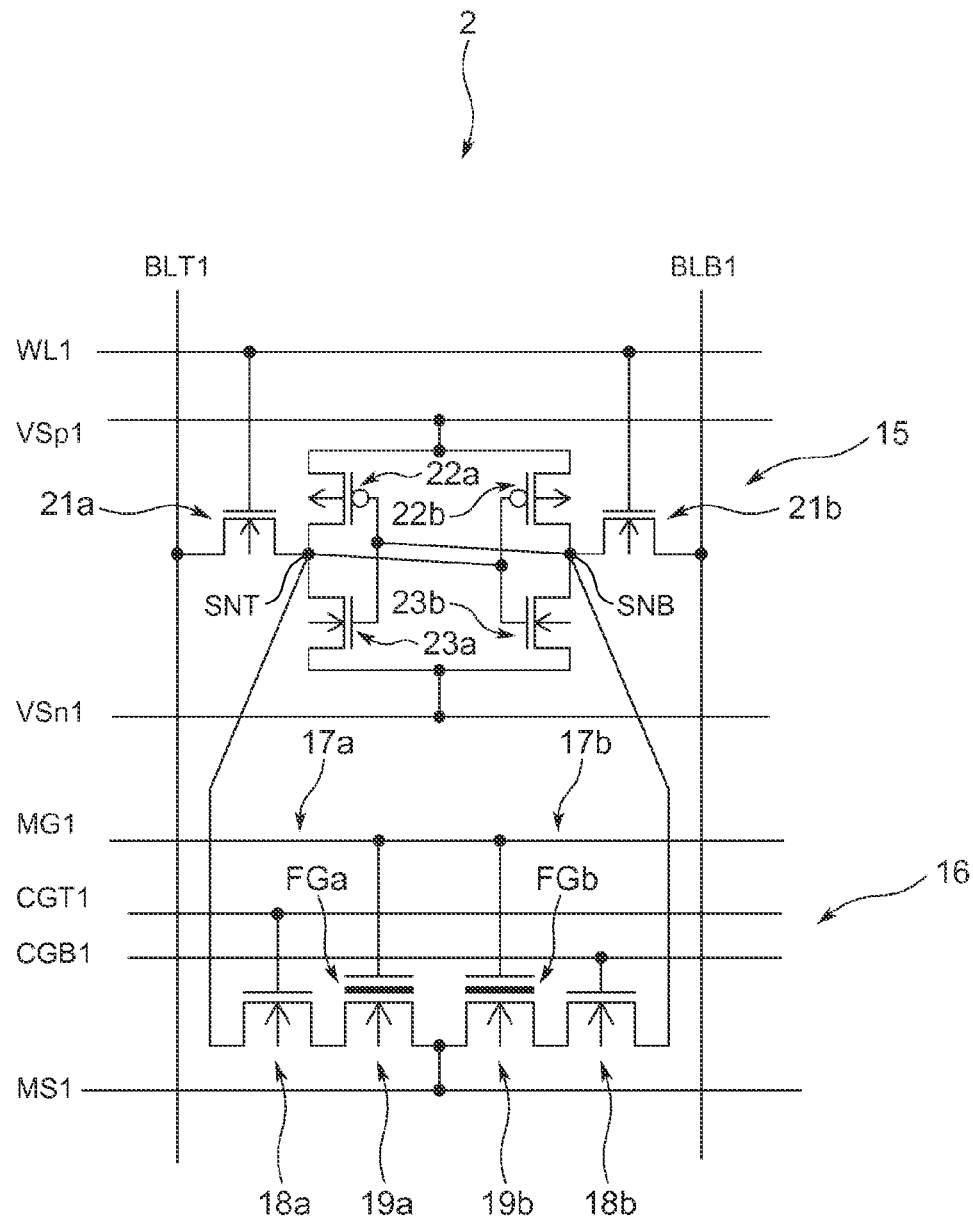
FIG. 2 is a schematic view illustrating a circuit configuration of a non-volatile SRAM memory cell.

The non-volatile SRAM memory cell 2 provided in the non-volatile semiconductor memory device 1 will be described below. All the non-volatile SRAM memory cells 2 arranged in a matrix shape have the same configuration. Therefore, only one of the non-volatile SRAM memory cells 2 is focused on in the following description. As illustrated in FIG. 2, the non-volatile SRAM memory cell 2 includes an SRAM 15 and a non-volatile memory unit 16, and has a configuration in which the non-volatile memory unit 16 is connected to a first storage node SNT and a second storage node SNB, which are paired with each other, in the SRAM 15.

The SRAM 15 includes a total of six metal-oxide-semiconductor (MOS) transistors, specifically a first access transistor 21a and a second access transistor 21b, which are paired with each other, each composed of an N-type MOS transistor, a first load transistor 22a and a second load transistor 22b, which are paired with each other, each composed of a P-type MOS transistor, and a first drive transistor 23a and a second drive transistor 23b, which are paired with each other, each composed of an N-type MOS transistor.

In this case, the SRAM 15 has a configuration in which one end of the first load transistor 22a and one end of the first drive transistor 23a are connected to each other, and includes the first storage node SNT between the first load transistor 22a and the first drive transistor 23a connected in series. The SRAM 15 has a configuration in which one end of the second load transistor 22b and one end of the second drive transistor 23b are connected to each other, and includes the second storage node SNB between the second load transistor 22b and the second drive transistor 23b connected in series. The respective other ends of the first load transistor 22a and the second load transistor 22b are connected to the power supply line VSp1, and the respective other ends of the first drive transistor 23a and the second drive transistor 23b are connected to the reference voltage line VSn1.

The first access transistor 21a has one end connected to the first storage node SNT and respective gates of the second load transistor 22b and the second drive transistor 23b and the other end connected to the complementary first bit line BLT1. The second access transistor 21b has one and connected to the second storage node SNB and respective gates of the first load transistor 22a and the first drive transistor 23a and the other end connected to the complementary second bit line BLB1. The first access transistor 21a and the second access transistor 21b have their respective gates connected to the common word line WL1, and can be turned on or off due to a voltage difference between the complementary first bit line BLT1 or the complementary second bit Line BLB1 and the word line WL1.

In the SRAM 15 thus configured, when external data is applied to the first storage node SNT and the second storage node SNB, respectively, as High-level and Low-level voltages, the external data can be written thereinto using an external data writing operation, described below. The external data can be stored as SRAM data in the first, storage node SNT and the second storage node SNB.

The non-volatile memory unit 16 connected to the SRAM 15 includes a first memory cell 17a and a second memory cell 17b. The first memory cell 17a and the second memory cell 17b constitute a one-bit complementary cell. In practice, in the non-volatile memory unit 16, the first storage node SNT in the SRAM 15 is connected to one end of a first switch transistor 18a in the first memory cell 17a while the second storage node SNB in the SRAM 15 is connected to one end of a second switch transistor 18b in the second memory cell 17b.

In the present embodiment, the first memory cell 17a includes the first switch transistor 18a composed of an N-type MOS transistor and a first memory transistor 19a composed of an N-type MOS transistor having a floating gate FGa as a first charge storage region, and the other end of the first, switch transistor 18a and one end of the first memory transistor 19a are connected to each other. The second memory cell 17b also includes the second switch transistor 18b composed of an type MOS transistor and a second memory transistor 19b composed of an N-type MOS transistor having a floating gate FGb as a second charge storage region, and the other end of the second switch transistor 18b and one end of the second memory transistor 19b are connected to each other.

In the non-volatile memory unit 16, the first switch transistor 18a has its gate connected to the first switch gate line CGT1 while the second switch transistor 18b has its gate connected to the second switch gate line CGB1 different from the first switch gate line CGT1. Thus, in the non-volatile memory unit 16, different switch gate voltages can be applied to the first switch transistor 18a and the second switch transistor 18b through the first switch gate line CGT1 and the second switch gate line CGB1, and the first switch transistor 18a and the second switch transistor 18b can be independently turned on or off due to respective voltage differences between the gates and one ends.

In the non-volatile SRAM memory cell 2, the first switch transistor 18a and the second switch transistor 18b can cut off an electrical connection state between the SRAM 15 and the non-volatile memory unit 16. Thus, the non-volatile memory unit 16 is electrically disconnected from the SRAM 15 by the first switch transistor 18a and the second switch transistor 18b during a writing operation for writing external data into the SRAM 15 from the outside and a data reading operation, and can be used as a general SRAM 15.

The first memory transistor 19a and the second memory transistor 19b have their respective gates connected to the memory gate line MG1 while having their respective other ends connected to the memory source line MS1, and a predetermined voltage can be applied thereto through the memory gate line MG1 and the memory source line MS1. When a high voltage is applied to the memory gate line MG1 and the memory source line MS1, for example, a high voltage, on the memory source line MS1 can reach an and of a channel region, on the side of the first switch transistor 18a, of the first memory transistor 19a. In this case, the high voltage on the memory source line MS1 can also similarly reach an end of a channel region, on the side of the second switch transistor 18b, of the second memory transistor 19b.

If a Low-level voltage is applied to the first storage node SNT in the SRAM 15 and a High-level voltage is applied to the second storage node SNB in the SRAM 15, for example, the first switch transistor 8a in the first memory cell 17a is turned on due to the voltage difference between the one end connected to the first storage node SNT and the gate when a High-level voltage is applied to the first switch gate line CGT1. Thus, in the first memory cell 17a, a channel region of the first switch transistor 18a can be set at a low voltage by the Low-level voltage at the first storage node SNT. Thus, the first memory cell 17a enters a state where a high potential difference occurs and a current flows in a boundary between the floating gate FGa of the first memory transistor 19a and the first switch transistor 18a. Therefore, charge can be injected into the floating gate FGa using source side injection (SSI) utilizing an intense electric field generated by a voltage drop.

In this case, in the second memory cell 17b, the second storage node SNB has the High-level voltage. Even if the High-level voltage is applied to the second switch gate line CGB1, the second switch transistor 18b can be turned off. Thus, in the second memory cell 17b, the second memory transistor 19b and the second storage node SNB are electrically disconnected from each other when the second switch transistor 18b is turned off, and an on-current does not flow in a boundary between the floating gate FGb of the second memory transistor 19b and the second switch transistor 18b. Therefore, charge is not accelerated, and is not injected into the floating gate FGb.

Thus, in the non-volatile SRAM memory cell 2, SRAM data (a High-level or Low-level voltage state), which have been stored in the first storage node SNT and the second storage node SNB in the SRAM 15 by writing external data, can be programmed into the first memory cell 17a and the second memory cell 17b in the non-volatile memory unit 16, and can be stored as memory data in the non-volatile memory unit 16.

In the non-volatile SRAM memory cell 2, voltages respectively required for an operation for programming data into the non-volatile memory unit 16 (hereinafter referred to as a programming operation) and an operation for not programming data (hereinafter referred to as a programming inhibition operation) can be lowered using source side injection performed in the non-volatile memory unit 16. Accordingly, respective voltages at the first storage node SNT and the second storage node SNB applied to the non-volatile memory unit 16 to perform the programming operation and the programming inhibition operation in the non-volatile memory unit 16 can also be lowered.

Thus, in the non-volatile SRAM memory cell 2, the programming operation and the programming inhibition operation in the non-volatile memory unit 16 can also be performed at the power supply voltage VDD (e.g., 1.8 [V] or less) in the SRAM 15. Therefore, in the SRAM 15, the thickness of a gate insulating film of each of the first access transistor 21a and the second access transistor 21b, the first load transistor 22a and the second load transistor 22b, and the first drive transistor 23a and the second drive transistor 23b can be set to 4 [nm] or less that can withstand the power supply voltage VDD.

In hot carrier injection on the drain side performed in a general memory transistor, a voltage to be applied to its gate needs to be made higher than a voltage to be applied to its drain. Thus, a programming operation for programming data and a programming inhibition operation for not programming data in a memory transistor by applying respective potentials, which are the power supply voltage VDD or less, on the first storage node SNT and the second storage node SNB to the source side of the memory transistor, like in the present invention, are difficult to perform in the conventional technique.

Also in carrier injection utilizing a tunneling current between bands performed in a conventional memory transistor, a voltage of 5 [V] to 10 [V] needs to be applied between its gate and a substrate to inject carriers. Thus, it is difficult to perform a programming operation and a programming inhibition operation at a potential that is approximately the power supply voltage VDD in the memory transistor.

On the other hand, in the non-volatile SRAM memory cell 2 according so the embodiment of the present invention, respective gate electrodes in the first switch transistor 18a and the second switch transistor' 18b for determining on/off of a current flowing through the first memory transistor 19a and the second memory transistor 19b and respective memory gate electrodes in the first memory transistor' 19a and the second memory transistor 19b for applying a voltage required to inject charge into the floating gates (charge storage regions) FGa and FGb are independent of each other in the non-volatile memory unit 16. Thus, a voltage required for the programming operation and the programming inhibition operation performed in the non-volatile memory unit 16 can be lowered.

Furthermore, during the programming operation in the non-volatile memory unit 16, the respective potentials at the first storage node SNT and the second storage node SNB are 0 [V] or the power supply voltage VDD. Thus, a gate voltage required to turn on or off the first switch transistor 18a and she second switch transistor 18b may be the power supply voltage VDD or less. A higher voltage than the power supply voltage VDD is not required for on/off operations of the first switch transistor 18a and the second switch transistor 18b. Thus, a gate insulating film of each of the first switch transistor 18a and the second switch transistor 18b can also be set to 4 [nm] or less.

Furthermore, in the non-volatile semiconductor memory device 1, when a programming operation for programming SRAM data into the non-volatile memory unit 16 from the SRAM 15 in the plurality of non-volatile SRAM memory cells 2, source side injection capable of injecting charge into either one of the floating gates FGa and FGb of the first memory cell 17a and the second memory cell 17b wish a relatively small on-current is used in each of the non-volatile memory units 16. Thus, power consumption for the programming operation is suppressed, and writing potential control can be collectively performed in a mat unit.

In the present embodiment, the thickness of the gate insulating film, of each of the first switch transistor 18a and the second switch transistor 18b in the non-volatile memory unit 16 can be made the same as the thickness of the gate insulating film of each of the first access transistor 21a, the second access transistor 21b, the first load transistor 22a, the second load transistor 22b, the first drive transistor 23a, and the second drive transistor 23b constituting the SRAM 15.

Figure 3:
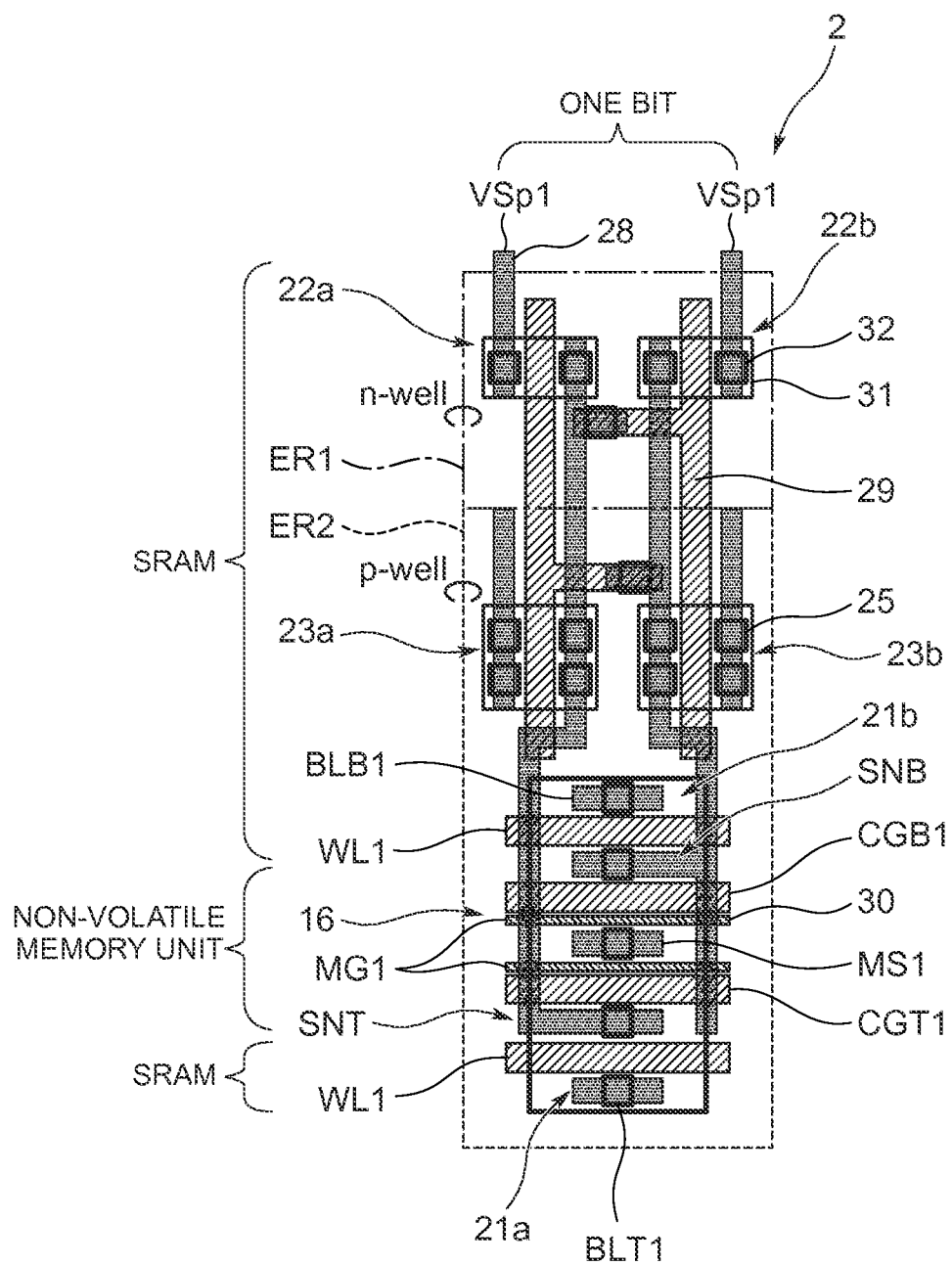
FIG. 3 is a schematic view illustrating a layout pattern of the circuit configuration of the non-volatile SRAM memory cell illustrated in FIG. 2.

FIG. 3 is a schematic view illustrating an example of a layout pattern for implementing a circuit configuration of the non-volatile SRAM memory cell 2 illustrated in FIG. 2. In this case, in the non-volatile SRAM memory cell 2, the first load transistor 22a and the second load transistor 22b in the SRAM 15 are formed in an N-type first semiconductor region ER1 (also written as "n-well" in FIG. 3), for example. In the non-volatile SRAM memory cell 2, transistors (i.e., the first switch transistor 18a, the second switch transistor 18b, the first memory transistor 19a, and the second memory transistor 19b (not illustrated)) constituting the non-volatile memory unit 16 are formed in a P-type second semiconductor region. ER2 (also written as "p-well" in FIG. 3), for example, of a conductivity type different from that of the first semiconductor region ER1.

In the second semiconductor region ER2, the first drive transistor 23a and the second drive transistor 23b and the first access transistor 21a and the second access transistor 21b in the SRAM 15 are also formed in addition to the non-volatile memory unit 16. In the non-volatile SRAM memory cell 2, the first drive transistor 23a and she second drive transistor 23b and the first access transistor 21a and the second access transistor 21b of the same conductivity type as that of the non-volatile memory unit 16 among the transistors constituting the SRAM 15 are formed in the second semiconductor region ER2 where the non-volatile memory unit 16 is formed. Therefore, the non-volatile SRAM memory cell 2 can be miniaturized as a whole because the second semiconductor region EPA where the non-volatile memory unit 16 is formed is used when the SRAM 15 is formed, and a semiconductor region dedicated to the SRAM 15 need not be separately formed.

In practice, the first load transistor 22a and the second load transistor 22b in the SRAM 15 are formed side by side in one direction in the first semiconductor region ER1, and the second semiconductor region ER2 is arranged adjacent to the first load transistor 22a and the second load transistor 22b. In the second semiconductor region ER2, the first drive transistor 23a and the second drive transistor 23b in the SRAM 15 are formed side by side in one direction in a region adjacent to the first semiconductor region ER1. Further, the second access transistor 21b in the SRAM 15, the non-volatile memory unit 16, and the first access transistor 21a in the SRAM 15 are formed in this order in the other direction away from the first semiconductor region ER1 (in this case, the other direction perpendicular to the one direction in which the first drive transistor 23a and the second drive transistor 23b are arranged).

In FIG. 3, the non-volatile SRAM memory cell 2 includes a metal layer 28, a first polysilicon (polycrystalline silicon) layer 29, a second polysilicon layer 30, an active region 31 where a MOS transistor and a diffusion layer are formed, and a contact 32. In the present embodiment, the metal layer 28 is connected as the power supply line VSp1 to each of the first load transistor 22a and the second load transistor 22b in the first semiconductor region ER1. The first drive transistor 23a, the non-volatile memory unit 16, and the first, access transistor 21a, which are formed in the second semiconductor region ER2, are connected in this order to another metal layer 28 connected to the first load transistor 22a, and a part of the other metal layer 28 can function as the first storage node SNT. The second drive transistor 23b, the second access transistor 21b, and the non-volatile memory unit 16 formed in the second semiconductor region ER2 are connected in this order to another metal layer 28 connected to the second load transistor 22b, and a part of the other metal layer 28 can function as the second storage node SNB.

In the second semiconductor region ER2, the complementary second bit line BLB1, the word line WL1, the second switch gate line CGB1, the memory gate line MG1, the first switch gate line CGT1, the word line WL1, and the complementary it bit line BLT1 are arranged in this order to match an arrangement order of the second access transistor 21b, the non-volatile memory unit 16, and the first access transistor 21a in the direction away from the first semiconductor region ER1. In the second semiconductor region ER2, the two memory gate lines MCI exist between the second switch gate line CGB1 and she first switch gate line CGT1, and the memory source line MS1 is arranged between the two memory gate lines MG1. When the non-volatile SRAM memory cell 2 is thus configured, the SRAM 15 and the non-volatile memory unit 16 can be efficiently arranged in a minimum area.

Figures 4A, 4B:
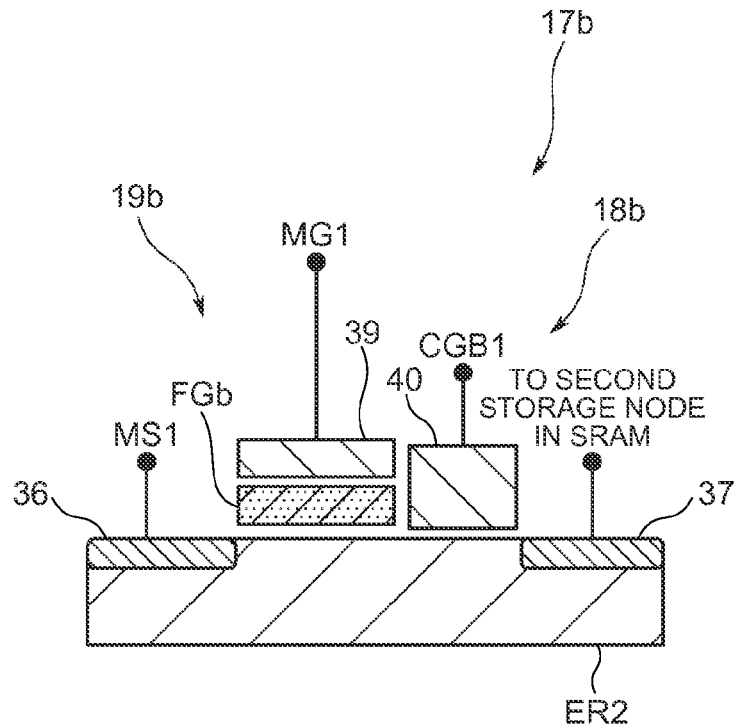
FIG. 4A is a schematic view illustrating a cross-sectional configuration of a second memory cell.
FIG. 4B is a table illustrating respective voltage values at each site during a programming operation for programming SRAM data into a non-volatile memory unit from an SRAM, during a memory data erasing operation in the non-volatile memory unit, during a writing operation for writing external data into the SRAM from the outside, and during a reading operation for reading out the SRAM data from the SRAM to the outside.

A cross-sectional configuration of the non-volatile memory unit 16 will be described below. The first memory cell 17a and she second memory cell 17b have the same configuration. Therefore, only the second memory cell 17b is focused on in the following description. In the present embodiment, the second memory cell 17b has a configuration in which source-drain regions 36 and 37 are spaced a predetermined distance apart from each other in an active region on the second semiconductor region ER2, as illustrated in FIG. 4A. The second storage node SNB in the SRAM 15 is connected to the source-drain region 37 serving as the one end of the second switch transistor 18b. The memory source line MS1 is connected to the source-drain region 36 serving as the other end of the second memory transistor 19b.

A channel region of the second switch transistor 18b and a channel region of the second memory transistor 19b are formed on an upper surface of the second semiconductor region ER2 between the source-drain regions 36 and 37, and the second switch transistor 18b and the second memory transistor 19b are arranged in series. In the second switch transistor 18b, a switch gate electrode 40 is formed on the channel region with the gate insulating film sandwiched therebetween, and the second switch gate line CGB1 is connected to the switch gate electrode 40. In the second memory transistor 19b, the floating gate FGb is formed on the channel region with the gate insulating film sandwiched therebetween, and a memory gate electrode 39 to which the memory gate line MG1 is connected is formed on the floating gate FGb with an insulating film sandwiched therebetween. In the second memory transistor 19b having such a configuration, when a large voltage difference occurs between the memory source line MS1 and the memory gate line MG1 at a high voltage and the second storage node SNB at a low voltage during a programming operation for programming SRAM data in the SRAM 15, a largest potential drop also occurs in a boundary with the second switch transistor 18b. Therefore, charge can be injected into she floating gate FGb using source side injection.

FIG. 4B indicates respective voltage values at each site of the non-volatile SRAM memory cell 2 during a programming operation for programming SRAM data into the non-volatile memory unit 16 from the SRAM 15 (written as "Program (sram to flash)" in FIG. 4B), during a data erasing operation for erasing data in the non-volatile memory unit 16 (written as "Erase (reset data in flash)" in FIG. 4B), during an external data writing operation for writing external data into the SRAM 15 from the outside (written as "Write (external data to sram)" in FIG. 4B), and during a reading operation for reading out data from the SRAM 15 (written as "Read (output sram data)" in FIG. 4B). In FIG. 4B, "Don't care" is written in a column corresponding to the site at which any voltage value can be set. The external data writing operation, the reading operation, the programming operation, and the data erasing operation will be described below. Further, the memory data writing operation for writing the memory data stored in the non-volatile memory unit 16 into the SRAM 15 will be sequentially described.

(2-1) External Data Writing Operation for Writing External Data into SRAM

First, the external data writing operation in the SRAM 15 will be described below. In the writing of the external data into the SRAM 15 from the outside, a predetermined power supply voltage VDD is applied to the word line WL1, and both the first access transistor 21a and the second access transistor 21b connected to the word line WL1 are turned on. In this case, the power supply voltage VDD is also applied to the power supply line. VSp1, and the reference voltage line. VSn1 is connected to the ground. In the SRAM 15 illustrated in FIG. 2, when the power supply voltage VDD is applied to the complementary first bit line BLT1, for example, 0 [V] can be applied to the complementary second bit line BLB1.

Thus, when the respective gates of the first load transistor 22a and the first drive transistor 23a are electrically connected to the complementary second bit line BLB1 via the second access transistor 21b, 0 [V] on the complementary second bit line BLB1 is applied to the gates. As a result, the first load transistor 22a is turned on, and the first drive transistor 23a is turned off. Therefore, the first storage node SNT between the first load transistor 22a and the first drive transistor 23a is electrically connected to the power supply line VSp1 via the first load transistor 22a, and a voltage at the first storage node SNT enters a High ("1")-level with the power supply voltage VDD flowing through the power supply line VSp1.

At this time, when the respective gates of the second load transistor 22b and the second drive transistor 23b are electrically connected to the complementary first bit line BLT1 via the first access transistor 21a, the power supply voltage VDD is applied to the gates. As a result, the second load transistor 22b is turned off, and the second drive transistor 23b is turned on. Therefore, the second storage node SNB between the second load transistor 22b and the second drive transistor 23b is electrically connected to the reference voltage line VSn1 via the second drive transistor 23b, and a voltage at the second storage node SNB enters a Low ("0")-level through the reference voltage line VSn1.

As described above, the SRAM 15 enters a state where the external data is written into the first storage node SNT and the second storage node SNB and is stored as SRAM data in the first storage node SNT and the second storage node SNB. In this case, in the non-volatile memory unit 16, the first switch transistor 18a and the second switch transistor 18b are turned off. Thus, the non-volatile memory unit 16 is electrically disconnected from the first storage node SNT and the second storage node SNB in the SRAM 15 so that only the SRAM 15 can be operated.

If the external, data is not written into the SRAM 15, 0 [V] is applied to the word line WL1, to turn off the first access transistor 21a and the second access transistor 21b. Thus, the SRAM 15 is electrically disconnected from the complementary first bit line BLT1 and the complementary second bit line BLB1 so that the external data can be prevented from being written into the SRAM 15.

(2-2) Operation for Reading Out SRAM Data from SRAM

A reading operation for reading out SRAM data stored in the SRAM 15 will be described below. When the SRAM data in the SRAM 15 is read out, the power supply voltage VDD is applied to the word line WL1, to turn on both the first access transistor 21a and the second access transistor 21b connected to the word line WL1. Thus, in the non-volatile SRAM memory cell 2, the sense amplifier/data input circuit. 9b (FIG. 1) connected to the complementary first bit line BLT1 and the complementary second bit line BLB1 can determine the SRAM data stored in the first storage node. SNT and the second storage node SNP, respectively, as a Low ("0")-level voltage and a High ("1")-level voltage by reading out a voltage at the first storage node. SNT via the complementary first bit line BLT1 while reading out a voltage an the second storage node SNB via the complementary second bit line BLB1.

If the SRAM data stored in the SRAM 15 is not read out, 0 [V] is applied to the word line WL1, to turn off the first access transistor 21a and the second access transistor 21b. Thus, the SRAM 15 is electrically disconnected from the complementary first bit line BLT1 and the complementary second bit line BLB1 so that the SRAM data can be prevented from being read out.

(2-3) Programming Operation for Programming SRAM Data into Non-volatile Memory Unit from SRAM In the embodiment of the present invention, the SRAM data stored in the SRAM 15 described above can be programmed into the non-volatile memory unit 16 based on the principle of source side injection. In the following description, it is supposed that the first storage node SNT enters a High-level where a voltage is high and the second storage node SNB enters a Low-level where a voltage is low in the SRAM 15.

In this case, in the non-volatile memory unit 16, 7 [V], for example, can be applied to the memory gate line MG1 while 6 [V], for example, can be applied to the memory source line MS1. In the non-volatile memory unit 16, the power supply voltage VDD can be applied to each of the first switch gate line CGT1 and the second switch gate line. CGB2. In the non-volatile memory unit 16, the first switch transistor 13a in the first memory cell 17a is electrically connected to the first storage node SNT into which data is written, and thus is turned off due to the voltage difference between the gate and the one end. Thus, in the first memory transistor 19a, the on-current is negligible and charge is not accelerated. Accordingly charge cannot be injected into the floating gate FGa.

On the other hand, in the non-volatile memory unit 16, the second switch transistor 18b in the second memory cell 17b is electrically connected no the second storage node SNB into which no data is written so that the one end of the second switch transistor 18b has the same Low-level voltage as that at the second storage node SNB. Thus, the second switch transistor 18b can be turned on. Therefore, a voltage difference increases between the second memory transistor 19b and the second switch transistor 18b. As a result, an intense electric field is generated so that an on-current flows, and charge is accelerated. Further, charge secondarily generated can be injected into the floating gate FGb. In the non-volatile SRAM memory cell 2, the SRAM data stored in the SRAM 15 can be programmed into the non-volatile memory unit 16, and can be stored as memory data in a non-volatile manner.

(2-4) Erasing Operation for Erasing Memory Data in Non-Volatile Memory Unit

The data erasing operation for erasing the memory data stored in the non-volatile memory unit 16 will be described below. The operation for erasing the memory data in the non-volatile memory unit 16 can include various erasing methods. For example, holes can be injected into the floating gates FGa and FGb using an erasing method using hole injection caused by a tunneling current between bands.

Respective voltage values at each site illustrated in "Erase (reset data in flash)" an FIG. 4B indicate those when hole injection caused by a tunneling current between bands is used. In this case, —7 [V] is applied to the memory gate line MG1 while 6 [V] is applied to the memory source line MS1. Thus, in the non-volatile SRAM memory cell 2, holes can be injected into the floating gate FGb storing charge, for example, from the memory source line MS1 due to a voltage difference between voltages respectively applied to the non-volatile memory unit 16 from the memory gate lire MG1 and the memory source line MS1, and memory data can be erased.

(2-5) Memory Data Writing Operation for Writing Memory Data in Non-Volatile Memory Unit into SRAM The memory data writing operation for writing the memory data stored in the non-volatile memory unit 16 into the SRAM 15 will be described below. The memory data writing operation according to a first embodiment, a memory data writing operation according to a second embodiment, a memory data writing operation according to a third embodiment will be sequentially described below. The memory data writing operation according to the first embodiment, the memory data writing operation according to the second embodiment, the memory data writing operation according to the third embodiment differ depending on a method for programming SRAM data into the non-volatile memory unit 16. Thus, the programming operation for programming the SRAM data into the non-volatile memory unit 16 will be first described.

(2-5-1) Memory Data Writing Operation According to First Embodiment

FIG. 5A is a flowchart illustrating a procedure for a programming operation for programming the SRAM data stored in the SRAM 15 into the non-volatile memory unit 16. FIG. 5B is a flowchart illustrating a procedure for she memory data writing operation for writing the memory data stored in the non-volatile memory unit 16 into the SRAM 15 according to the flowchart illustrated in FIG. 5A. These are described in order below.

In this case, as illustrated in FIG. 5A, in step SP1, the non-volatile SRAM memory cell 2 is instructed to program the SRAM data into the non-volatile memory unit 16. In step SP2, the memory data in the non-volatile memory unit 16 is erased. Thus, the non-volatile memory unit 16 ejects charge, which has been injected into the floating gate FGa of the first memory transistor 19a or the floating gate FGb of the second memory transistor 19b, and enters an initial state where no memory data is written.

Then, in step SP3, the SRAM data stored in the SRAM 15 is programmed into the non-volatile memory unit 16. As illustrated in FIG. 6A, the programming operation for programming the SRAM data into the non-volatile memory unit 16 and the memory data writing operation for writing the memory data in the non-volatile memory unit 16 into the SRAM 15 will be described by taking a case where the first storage node SNT in the SRAM 15 is at a Low-level voltage (0 [V]) and the second storage node SNB is at a High-level voltage (the power supply voltage VDD) as an example. In this case, the non-volatile memory unit 16 first ejects charge stored in either one of the floating gates FGa and Fob of the first memory transistor 19a and the second memory transistor 19b, as described above, and enters a state where a threshold voltage Vth is less than 0 [V] (threshold voltage Vth<0 [V]), i.e., the memory data has been erased.

Then, in the non-volatile memory unit 16, the first switch transistor 18a is turned on due to the voltage difference between the gate and the one end in the first memory cell 17a connected to the first storage node SNT at a Low-level, and charge is injected into the floating gate FGa using source side injection. Thus, the non-volatile memory unit 16 enters a state where data has been written into the first memory transistor 19a (threshold voltage Vth>0 [V]).

On the other hand, in the non-volatile memory unit 16, the second switch transistor 18b is turned off due to the voltage difference between the gate and the one end in the second memory cell 17b connected to the second storage node SNB at a High-level. Thus, the non-volatile memory unit 16 enters a state where no data has been written into the second memory transistor 19b (threshold voltage Vth<0 [V]). Thus, the SRAM date is programmed into the non-volatile memory unit. 16, and is stored as memory data.

Then, the memory data stored in the non-volatile memory unit 16 can be written into the SRAM 15 according to the instruction to write the memory data into the SRAM. The memory data stored in the non-volatile memory unit 16 is written into the SRAM 15 in a procedure as illustrated in FIG. 5B. As illustrated in FIG. 5B, in step SP4, the non-volatile SRAM memory cell 2 is instructed to write the memory data into the SRAM 15. In step SP5, the SRAM data stored in she SRAM 15 is reset. For example, as illustrated in FIG. 5B and FIG. 6B, the SRAM 15 is reset by (i) setting the power supply line VSp1 at 0 [V] to cut off the supply of power to the SRAM 15, (i) setting the word line WL1 at the power supply voltage VDD, (i) setting the complementary first bit line BLT1 and the complementary second his line BLB1 at 0 [V], and (i) turning on the first access transistor 21a and the second access transistor 21b to set the first storage node SNT and the second storage node SNB at 0 [V]. Thus, the SRAM 15 is reset.

Then, the complementary first his line BLT1 and the complementary second bit line Mal are electrically disconnected from the SRAM 15 by (ii) setting the word line WL1 at 0 [V] to turn off the first access transistor 21a and the second access transistor 21b. As illustrated in FIG. 5B, in step SP6, the memory data stored in the non-volatile memory unit 16 is sent to the SRAM 15. In this case, (iii) the memory source line MS1 is set at the power supply voltage VDD, and (iii) the first switch gate line CG1 and the second switch gate line CGB1 are set at the power supply voltage VDD, as illustrated in FIGS. 5B and 6B.

Thus, (iv) the second memory cell 17b on the non-writing side (threshold voltage Vth<0 [V] side) is electrically connected so she second storage node SNB in the SRAM 15 with the power supply voltage VDD applied to the memory source line MS1. Thus, in the SRAM 15, the second storage node SNB is set at a High-level voltage (the power supply voltage VDD–the threshold voltage Vth of the second switch transistor 18b) with the power supply voltage VDD applied to the memory source line MS1. Then, (V) the power supply line VSp1 is set at the power supply voltage VDD, and the SRAM. 15 is latched. Thus, the non-volatile SRAM memory cell 2 can write the memory data stored in the non-volatile memory unit 16 into the SRAM 15.

(2-5-2) Memory Data Writing Operation According to Second Embodiment

A memory data writing operation according to a second embodiment will be described below. In the above described memory data writing operation according to the first embodiment, the method for feeding the power supply voltage VDD on the memory source line MS1 into the second storage node SNB in the SRAM 15 is used. Thus, the operation becomes complicated because the SRAM 15 needs to be reset. Therefore, there is a limit so a high-speed operation. In she memory data writing operation according to the first embodiment, the first switch transistor 18a or the second switch transistor 18b is turned on using the power supply voltage. VDD on a core MOS applied to the first switch gate line CGT1 and the second switch gate line CGB1. Thus, a High-level voltage at the first storage node SNT or the second storage node SNB becomes (power supply voltage VDD–threshold voltage Vth), and there is also a limit to a low-voltage operation. The threshold voltage Vth means a threshold voltage of the first switch transistor 18a or the second switch transistor 18b.

On the other hand, in the memory data writing operation according to the second embodiment, a low-voltage operation can be implemented at a higher speed than in the memory data writing operation according to the first embodiment. FIG. 7A is a flowchart illustrating a procedure for a programming operation for programming SRAM data into a non-volatile memory unit 16 from an SRAM 15, which is previously performed due to performing the memory data writing operation according to the second embodiment. FIG. 7B is a flowchart illustrating a procedure for the memory data writing operation according to the second embodiment for writing memory data stored in the non-volatile memory unit 16 into the SRAM 15 according to the flowchart of FIG. 7A. In this case, as illustrated in FIG. 7A, when a non-volatile SRAM memory cell 2 is instructed to program the SRAM data into the non-volatile memory unit 16 in step SP11, the processing proceeds to steps SP12 and SP13.

In step SP12, the memory data in the non-volatile memory unit 16 is erased. Thus, the non-volatile memory unit 16 ejects charge, which has been injected into a floating gate FGa of a first memory transistor 19a or a floating gate. FGb of a second memory transistor 19b, and enters an initial state where no data is written. In step SP13 performed together with step SP12, the SRAM data in the SRAM 15 is read out, and inverted data obtained by logically inverting the SRAM data is written into the SRAM 15.

In practice, a process in step SP13 is performed by a data inversion circuit 4 illustrated in FIG. 1. The data inversion circuit 4 reads out a High-level or Low-level voltage in a first storage node SNT and a second storage node SNB in the SRAM 15, respectively, via a complementary first bit line BLT1 and a complementary second bit line BLB1. Then, the data inversion circuit 4 can detect the High-level voltage and the Low-level voltage, adjust voltages to be respectively applied to the complementary first bit line BLT1 and the complementary second bit line BLB1 according to "(2-1) External Data Writing Operation for Writing External Data into SRAM", described above, and apply voltages obtained by logically inverting the High-level and the Low-level to the first storage node SNT and the second storage node SNB in the SRAM 15, respectively. Thus, as illustrated in FIG. 8A, the SRAM 15, for example, can invert a Low-level voltage (0 [V] data=0) at the first storage node SNT in its initial state before inversion into a High-level voltage (power supply voltage VDD: data=1), and can invert a High-level voltage (power supply voltage VDD: data=1) at the second storage node SNB in its initial state before inversion into a Low-level voltage (0 [V]: data=0).

Processing for inverting the SRAM data in the SRAM 15 by the data inversion circuit 4 can be performed simultaneously with an operation for erasing' the memory data in the non-volatile memory unit 16 by being performed while a first switch transistor 18a and a second switch transistor 18b in the non-volatile memory unit 16 are turned off. Step S13 of performing the SRAM data inversion processing and step SP12 of performing the memory data erasing operation need not be simultaneously performed. Either one of the steps may be first performed.

Then, as illustrated in FIG. 7A, in step SP14, the inverted data stored in the SRAM 15 is programmed into the non-volatile memory unit 16. In the non-volatile memory unit 16, the inverted data stored in the SRAM 15 can be programmed into the first memory transistor 19a and the second memory transistor 19b from which the memory data has been erased in step SP12 (threshold voltage Vth<0 [V]). In practice, in the non-volatile memory unit 16, the first, switch transistor 18a is turned off due to a voltage difference between its gate and one end in a first memory cell 17a connected to the first storage node SNT at a High-level, for example. Thus, the non-volatile memory unit 16 can enter a state where no data has been written into the first memory transistor 19a (non-writing state: threshold voltage Vth<0 [V]).

On the other hand, in the non-volatile memory unit 16, the second switch transistor 18b is turned on due to a voltage difference between its gate and one end in a second memory cell 17b connected to the second storage node SNB at a Low level, and charge is injected into a floating gate FGb using source side injection. Thus, the non-volatile memory unit 16 can enter a state where data has been written into the second memory transistor 19b (writing state: threshold voltage Vth>0 [V]). Thus, the inverted data in the SRAM 15 can be stored as memory data in the non-volatile memory unit 16.

The memory data stored in the non-volatile memory unit 16 is written into the SRAM 15 in a procedure as illustrated in FIG. 7B. As illustrated in FIG. 7B, in step SP15, the non-volatile SRAM memory cell 2 is instructed to write the memory data into the SRAM 15 from the non-volatile memory unit 16. In step SP16, (i) the power supply line VSp1 is set at a voltage of Hi-Z or 0 [V], to cut off the supply of power to the SRAM 15. Then, in step SP17, the memory data in the non-volatile memory unit 16 is written into the SRAM 15. In this case, as illustrated in FIGS. 7B and 8B, (i) a first switch gate line CGT1 and a second switch gate line CGB1 are set at the power supply voltage VDD, and a memory source line MS1 is set at 0 [V]. Thus, (ii) the first storage node SNT in the SRAM 15 is connected to the memory source line MS1 via the first memory cell 17a on the non-writing side (threshold voltage Vth<0 [V]side), and the first storage node SNT is set at a Low-level voltage (0 [V]: data=0). Then, (iii) the power supply line VSp1 is set at the power supply voltage VDD to be latched in the SRAM 15, and the first storage node SNT is set at the Low-level voltage and the second storage node STAB is set at a High-level voltage.

Thus, the Low-level voltage (0 [V]: data=0) has been applied before the inversion to the first storage node SNT in she SRAM 15. However, the same Low-level voltage (0 [V]: data=0) as that before the inversion can be applied by writing the memory data stored in the non-volatile memory unit 16 into she SRAM 15. On the other hand, the High-level voltage (the power supply voltage VDD: data=1) has been applied before the inversion to the second storage node SNB in the SRAM 15. However, the same High-level voltage (the power supply voltage VDD: data=1) as that before the inversion can be applied by writing the memory data stored in the non-volatile memory unit 16 into the SRAM 15.

Thus, she non-volatile SRAM memory cell 2 can apply she same High-level and Low-level voltages as the SRAM data stored in the SRAM 15 before the inversion, respectively, to the first storage node SNT and the second storage node SNB by writing the memory data stored in the non-volatile memory unit 16 into the SRAM 15.

More specifically, in the memory data writing operation according to the second embodiment, inverted data obtained by logically inverting a High-level and a Low-level serving as the SRAM data is previously stored in the SRAM 15 before the SRAM data is programmed into the non-volatile memory unit 16, and is programmed into the non-volatile memory unit 16. Thus, in the memory data writing operation according to the second embodiment, when the memory data in the non-volatile memory unit 16 is written into the SRAM 15, the writing operation can be performed with the memory source line MS1 set at 0 [V]. Therefore, the operation can be simplified because the SRAM 15 need not be reset, unlike in the above described memory data writing operation according to the first embodiment.

Therefore, a high-speed operation can be performed. In the memory data writing operation according to the second embodiment, the Low-level voltage of the non-volatile memory unit 16 is fed into the SRAM 15. The memory data writing operation is the same as the writing operation into the SRAM 15 from the outside, and thus becomes a simple and stable operation. Therefore, a high-speed and low-voltage operation can be performed.

In the present embodiment, when she memory data in the non-volatile memory unit 16 is written into the SRAM 15, the power supply line VSp1 is set at a voltage of Hi-Z or 0 [V], so cut off the supply of power to the SRAM 15. Even if a memory current flowing through the non-volatile memory unit 16 is relatively smaller than a current (a load pmos current) from the power supply line VSp1 in the SRAM 15, therefore, the supply of the power to the SRAM 15 is cut off through the power supply line VSp1. Thus, the first storage node SNT or the second storage node SNB, which enters a Low-level in the SRAM 15, can be easily introduced into a Low-level voltage with a memory current.

Figure 9A:
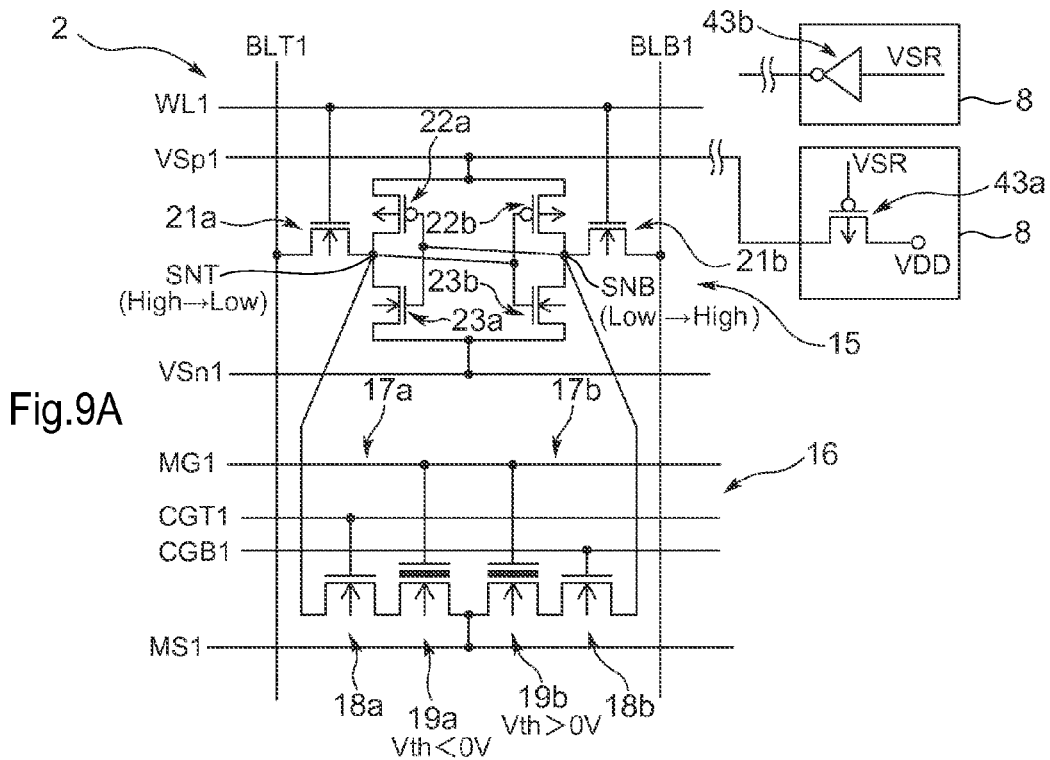
FIG. 9A is a schematic view illustrating a circuit configuration of two types of SRAM power supply control circuits.
Figure 10:
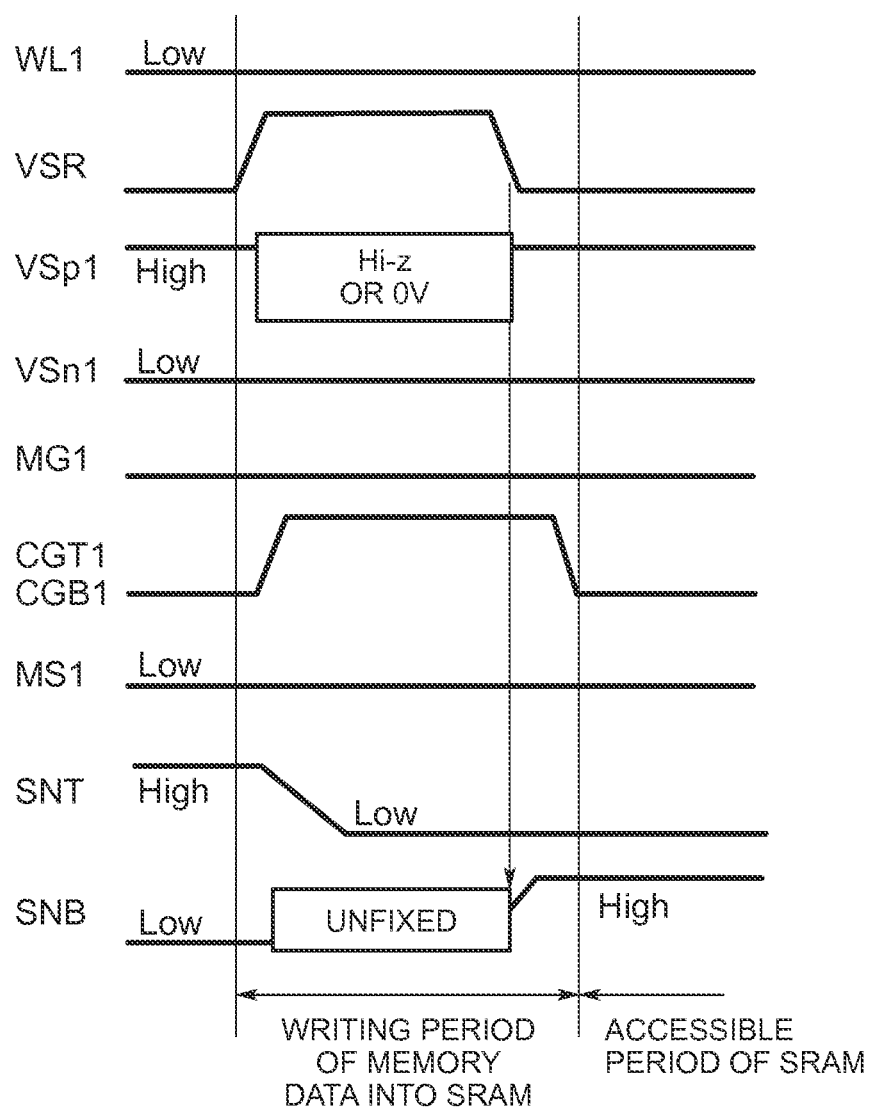
FIG. 10 is a timing chart illustrating respective voltage states at sites during the memory data writing operation.

An SRAM power supply control circuit 8 can cut off the supply of the power so she SRAM 15 through the power supply line VSp1, as illustrated in FIG. 9A. FIG. 9A illustrates two types of SRAM power supply control circuits 8 (a power supply control transistor 43a and a power supply control inverter 43b) having different circuit configurations as an example. One of the SRAM power supply control circuits 8 includes the power supply control transistor 43a composed of a P-type MOS transistor. The power supply control transistor 43a has one end connected to the power supply line VSp1 and has a gate connected to the power supply control gate line VSR. In this case, the power supply voltage VDD is applied to the other end of the power supply control transistor 43a. In this state, as illustrated in FIG. 10, when a predetermined voltage is applied to the gate from the power supply control gate line VSR due to a shift to a writing period of the memory data into the SRAM 15, the power supply control transistor 43a is turned off to set a voltage to the SRAM 15 through, the power supply line VSp1 at Hi-Z or 0 [V] and cut off the supply of the power to the SRAM 15.

In the writing period of the memory data into the SRAM 15, a voltage is applied to the first switch gate line CGT1 and the second switch gate line CGB1, the first switch transistor 18a and the first memory transistor 19a are turned on in the first memory cell 17a on the non-writing side (threshold voltage Vth<0 [V]) on which no charge is injected into the floating gate FGa, for example, and the first storage node SNT in the SRAM 15 enters a Low-level (0 [V]) when electrically connected to the memory source line MS1. Then, the power supply control transistor 43a is turned on when the supply of a voltage to the power supply control gate line VSR is stopped so that the power supply voltage VDD can be applied again to the power supply line VSp1. Thus, in the SRAM 15, the second storage node SNB can enter a. High-level voltage state with the power supply voltage VDD on the power supply line VSp1.

As another SRAM power supply control circuit 8, a power supply control inverter 43b may be provided on a power supply line VSp1, as illustrated in FIG. 9A. In this case, the power supply control inverter 43b can apply the power supply voltage VDD to the power supply line VSp1 and cut off the supply of the power by controlling application of a voltage to a power supply control gate VSR, and can write the memory data in the non-volatile memory unit 16 into the SRAM 15, like the power supply control transistor 43a, described above.

Figure 9B:
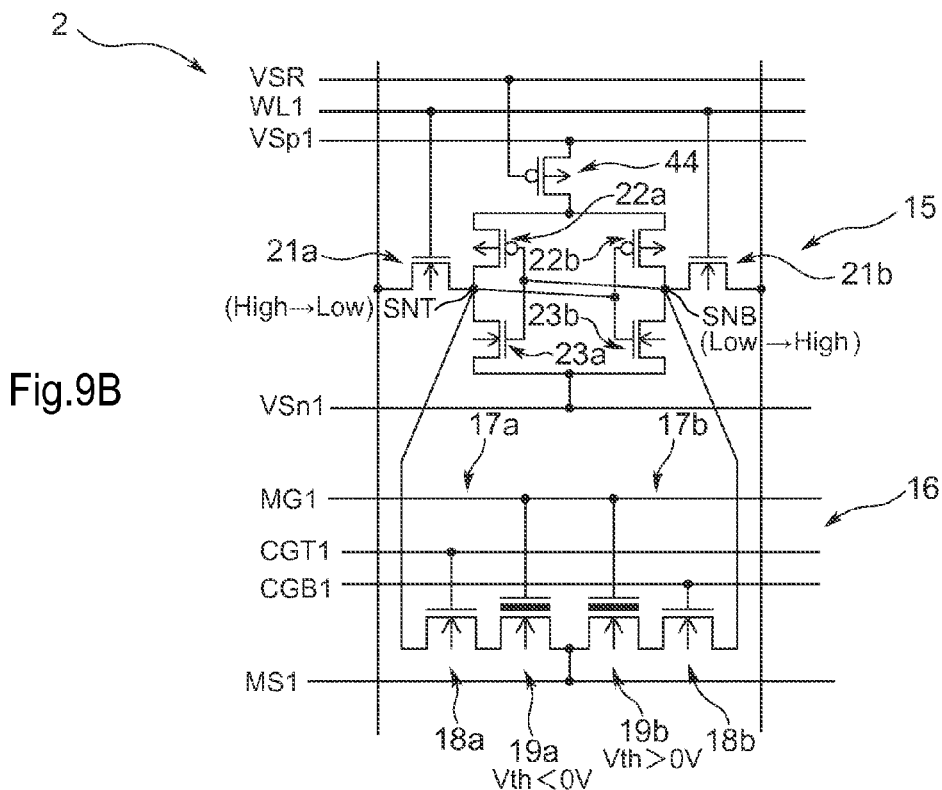
FIG. 9B is a schematic view when a power supply control transistor is provided for each non-volatile SRAM memory cell.

The power supply control transistor 43a and the power supply control inverter 43b illustrated in FIG. 9A are provided for each of power supply lines VSp0, VSp1, VSp2, and VSp3, and can apply the power supply voltage VDD and cut off the supply of the power for each of the power supply lines VSp0, VSp1, VSp2, and VSp3. The present invention is not limited to this. As illustrated in FIG. 9B, the power supply control transistor 44 may be provided for each of the non-volatile SRAM memory cells 2, to apply the power supply voltage VDD from the power supply line VSp1 and cut off the supply of the power for each of she non-volatile SRAM memory cells 2.

In this case, the power supply control gate line VSR is provided for each of the power supply lines VSp0, VSp1, VSp2, and VSp3. For example, the non-volatile SRAM memory cell 2 is connected to the power supply control gate line VSR provided on the power supply line VSp1 via the power supply control transistor 44. In practice, the power supply control transistor 44 has a gate connected to the power supply control gate line VSR while having one end connected to the power supply line VSp1 and the other end connected to respective other ends of a first load transistor 22a and a second load transistor 22b. Thus, the power supply control transistor 41 can apply the power supply voltage VDD on the power supply line VSp1 to the it load transistor 22a and the second load transistor 22b or cut off the supply of the power by changing a voltage to be applied to the power supply control gate line. VSR, and can write the memory data in the non-volatile memory unit 16 into the SRAM 15, like the power supply control transistor 43a and the power supply control inverter 43b illustrated in FIG. 9A, described above.

(2-5-3) Memory Data Writing Operation According to Third Embodiment

A memory data writing operation according to a third embodiment will be described below. In this case, as illustrated in FIG. 5A, an operation for erasing memory data in a non-volatile memory unit 16 is performed (step SP2) according to an instruction to program SRAM data into a non-volatile memory unit 16 (step SP1), and the SRAM data is then programmed into the non-volatile memory unit 16. Then, the memory data stored in the non-volatile memory unit 16 is written into an SRAM 15 according to a flowchart illustrated in FIG. 7B.

In this state, if a Low-level voltage is applied to a first storage node SNT in the SRAM 15 and a High-level voltage is applied to a second storage node SNB in an initial state, for example, when the SRAM data is programmed into the non-volatile memory unit 16 according to the flowchart illustrated in FIG. 5A, and then the memory data is written into the SRAM 15 from the non-volatile memory unit 16 according to the flowchart illustrated in FIG. 7B, a High-level voltage different from that in the initial state is applied to the first storage node SNT in the SRAM 15, and a Low-level voltage different from that in the initial state is also applied to de second storage node SNB. Therefore, in this state, data including a High-level voltage and a Low-level voltage opposite to those in the SRAM data in the initial state is stored in the SRAM 15.

In the memory data writing operation according to the third embodiment, in step SP17 illustrated in FIG. 7B, (iii) the SRAM 15 is latched, and the SRAM data stored in the SRAM 15 by writing the memory data thereinto is then read out by an inversion circuit. 4, and inverted data obtained, by logically inverting the SRAM data is written into the SHAM 15. Thus, in the SHAM 15, a Low-level voltage can be applied to the first storage node SNT and a High-level voltage can be applied to the second storage node SNB, like in the initial state.

(2-6) Monitoring of Threshold Voltage in Non-Volatile Memory Unit

Figure 11:
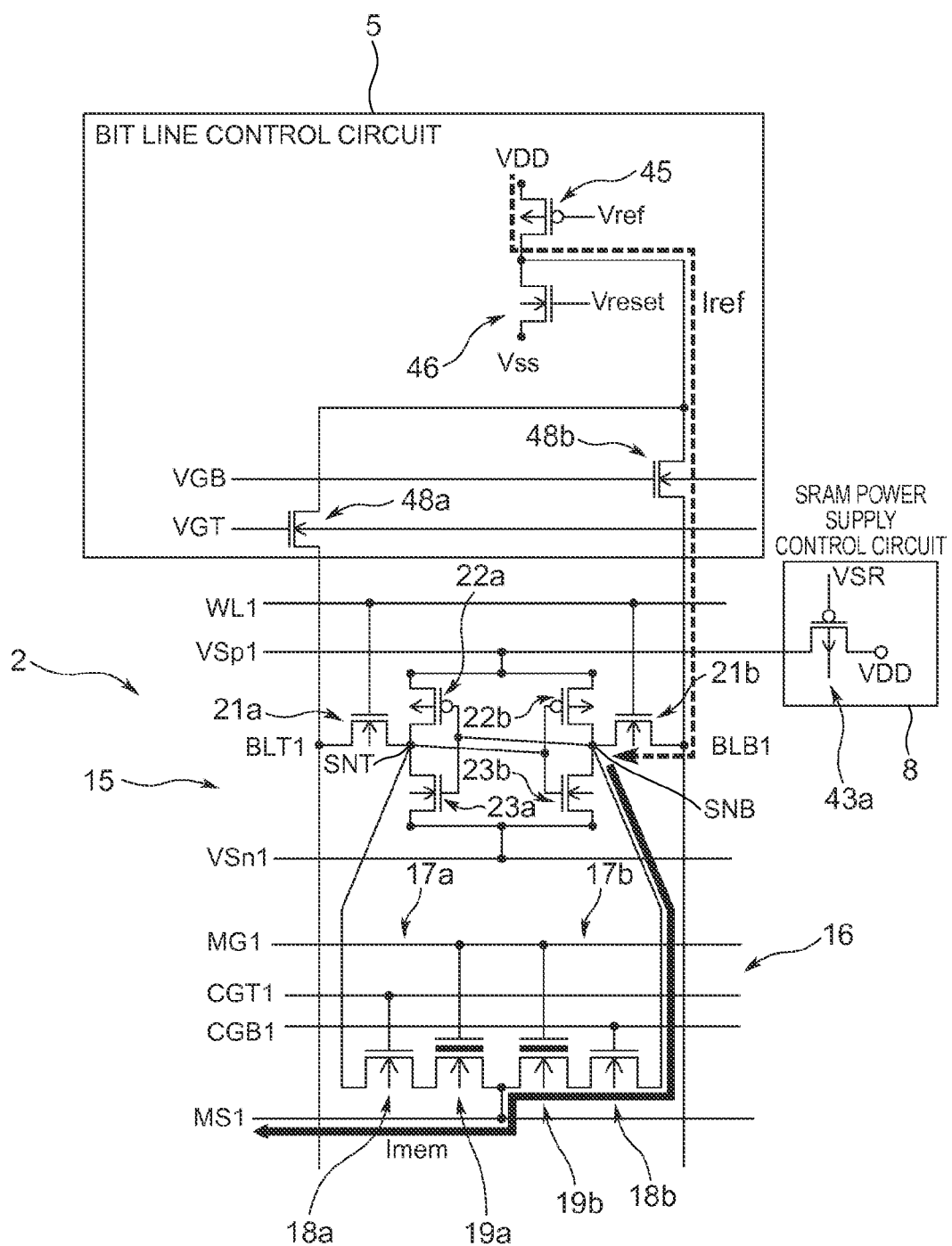
FIG. 11 is a circuit diagram provided for describing monitoring of a threshold voltage.

In a non-volatile semiconductor memory device 1 according to the third embodiment of the present invention can monitor a Threshold voltage Vth of the non-volatile memory unit 16 in each of non-volatile SRAM memory cells 2. In this case, as illustrated in FIG. 11, a bit line control circuit 5 connected to a complementary first bit line BLT1 and a complementary second bit line BLB1 includes a first transistor 45 composed of a P-type MOS transistor and a second transistor 46 composed of an N-type MOS transistor. The first transistor 45 and the second transistor 46 have their respective one ends connected to each other, and are connected in series.

The first transistor 45 has a gate connected to a gate line Vref, and the other end to which a power supply voltage VDD can be applied. The second transistor 46 has a gate connected to a gate line Vreset, and the other end to which a reset voltage Vss can be applied. The complementary first bit line BLT1 is connected between the first transistor 45 and the second transistor 46 via a first switching transistor 48a while the complementary second bit line BLB1 is connected therebetween via a second switching transistor 48b. The first switching transistor 48a has a gate connected to a first switching gate line VGT, and the second switching transistor 48b has a gate connected to a second switching gate line VGB. Thus, the first switching transistor 48a and the second switching transistor 48b can be independently turned on or off.

Figure 12:
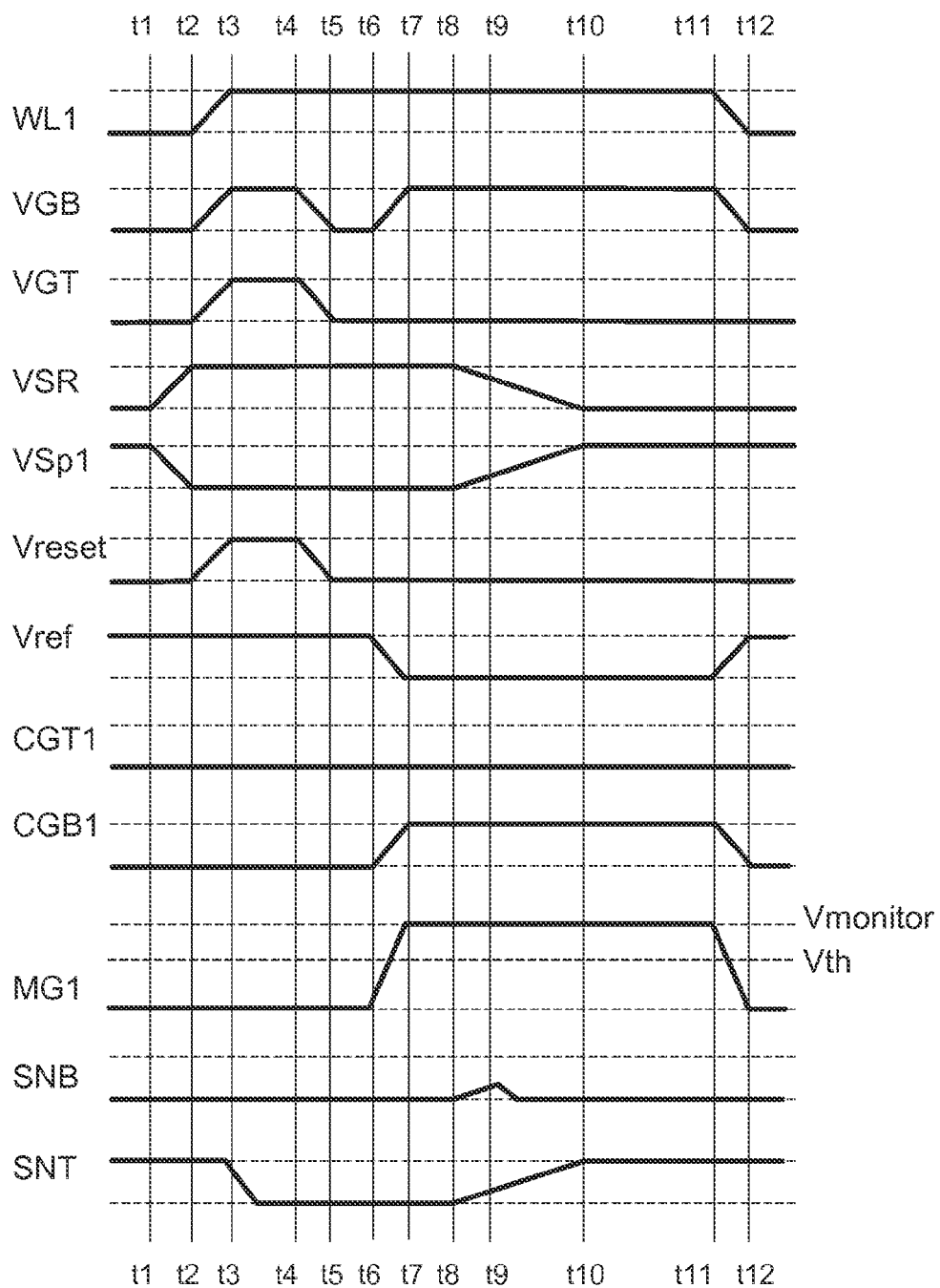
FIG. 12 is a timing chart illustrating respective voltage states at sites in monitoring the threshold voltage.

A case where a threshold voltage Vth of the second memory cell 17b on the side of the complementary second bit line BLB1 is monitored, assuming that the first storage node SNT in the SRAM 15 is at a High-level voltage and the other second storage node SNB in the SRAM 15 is at a. Low-level voltage will, be described below. FIG. 12 illustrates respective voltage transitions at sites when the threshold voltage Vth of the second memory cell 17b in the non-volatile memory unit 16 is monitored. In the description of FIG. 12, time is divided into t1 to t12 along a time axis.

First, at t1 to t2, application of a power supply voltage VDD through a power supply line VSp1 is cut off, to stop a function of latching the SRAM 15. In practice, at t1 to t2, a power supply control transistor 43a composed of a P-type MOS transistor is turned of by raising a voltage on a power supply control gate line VSR in an SRAM power supply control circuit 8, and application of the power supply voltage VDD by the power supply line VSp1 is cut off, to stop the function of latching the SRAM 15. At t2 to t4, a predetermined voltage is applied to a word line WL1, the first switching gate line VGT, the second switching gate line VGB, and the gate line Vreset, to respectively turn on a first access transistor 21a and a second access transistor 21.b in the SRAM 15, the second transistor 46, the first switching transistor 48a, and she second switching transistor 48b in the hit line control circuit 5.

Thus, in the SRAM 15, the reset voltage Vss can be applied to the first storage node SNT and the second storage node SNB. Then, at t4 to t5, application of a voltage to the first switching gate line VGT, the second switching gate line. VGB, and the gate line Vreset is stopped, and the first switching transistor 48a, the second switching transistor 48b, and the second transistor 46 are turned off, to end reset work.

Then, at t6 to t7, the first transistor 45 is turned on by lowering a voltage on the gate line Vref while the second switching transistor 48b is turned on by raising a voltage on the second switching gate line VGB, to prepare to supply' a reference current Iref to the second storage node SNB. At t6 to t7, a second switch transistor 18b is turned on by raising a voltage on a second switch gate line CGB1. In the non-volatile memory unit 16, a measurement voltage Vmonitor having a predetermined voltage value is applied to a memory gate line MG1, to examine the threshold voltage Vth, to prepare to enable comparison between a memory current Imam flowing through the second memory cell 17b and the reference current Iref to be supplied to the second storage node SNB.

Then, at t8 to t10, a voltage on the power supply control gate line VSR in the SRAM power supply control circuit 8 is lowered, and the power supply line VSp1 is brought near the power supply voltage VDD by turning on the power supply control transistor 43a. Thus, the first storage node SNT and the second storage node SNB slightly rise from the ground (GND). At this time, a voltage at which the reference current. Iref is made to flow through the second memory cell 17b is set to the threshold voltage Vth. If the measurement voltage Vmonitor is more than the threshold voltage Vth, the memory current Imem is larger than the reference current Iref in the second storage node SNB. When the power supply voltage VDD is applied to the power supply line VSp1 (t9 to t10), the second storage node SNB is set at a Low-level voltage, and the first storage node SNT is set at a High-level voltage with the memory current Imem.

On the other hand, if the threshold voltage Vth is high, and is higher than the current measurement voltage Vmonitor, when the power supply voltage VDD is applied to the power supply line VSp1 (t9 to t10), the second storage node SNB is set at a High-level voltage with the reference current Iref, and the first storage node SNT is latched to a Low-level voltage (not illustrated).

Then, at t11 to t12, the first transistor 45 is turned off by raising a voltage on the gate line. Vref while the second switching transistor 48b is turned off by lowering a voltage on the second switching gate line VGB. At t11 to t12, the first access transistor 21a and the second access transistor 21b are turned of by lowering a voltage on the word line WL1 while the second switch transistor 18b is turned off by lowering a voltage on the second switch gate line CGB1. Further, the supply of a voltage to the memory gate line MG1 is stopped, to end an operation for latching the SRAM 15.

Then, the voltages latched in the first storage node SNT and the second storage node SNB in the SRAM 15 are read out according to "(2-2) Operation for Reading out SRAM Data from SRAM", described above. At this time, if the second storage node SNB is at a High-level voltage, for example, the voltage value of the current measurement voltage Vmonitor indicates that the reference current. Iref is higher than the memory current Imem and the second storage node SNB is at a High-level voltage with the reference current Iref. This indicates that the voltage value of the current measurement voltage Vmonitor used to monitor the threshold voltage Vth is lower than the threshold voltage. Vth of the second memory cell 17b.

On the other hand, if the second storage node SNP, is at a Low-level voltage, for example, the voltage value of the current measurement voltage Vmonitor indicates that the memory current Imem is higher than the reference current Iref and the second storage node SNB is at a Low-level voltage with the memory current Imem. This indicates that the voltage value of the current measurement voltage Vmonitor used to monitor the threshold voltage Vth is higher than the threshold voltage Vth of the second memory cell 17b.

Figure 13:
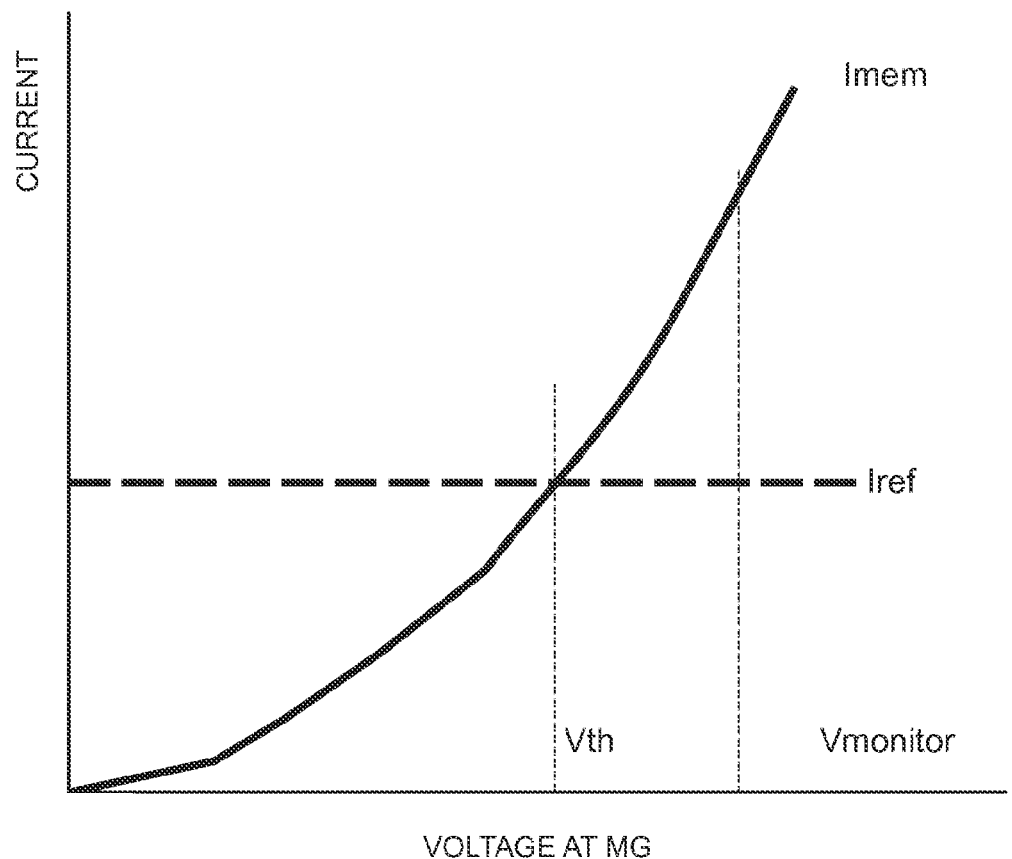
FIG. 13 is a graph illustrating a relationship among a measurement voltage Vmonitor, a memory current Imem, and a reference current Iref.

Therefore, as illustrated in FIG. 13, when the threshold voltage Vth of the non-volatile memory unit 16 is monitored, the voltage value of the measurement voltage Vmonitor to be applied co the memory gate line MG1 is changed, to repeatedly detect whether the second storage node SNB is at a High-level voltage with the reference current Iref or is at a Low-level voltage with the memory current Imem for each of the changed voltage values. Thus, the threshold voltage Vth of the second memory cell 17b can be specified.

In the foregoing configuration, in the non-volatile SRAM memory cell 2, when the threshold voltage Vth of the non-volatile memory unit 16 is monitored, the supply of a voltage through the power supply line VSp1 is cut off to stop a function of latching the SRAM 15. Thus, the threshold voltage Vth of the non-volatile memory unit 16 can be monitored utilizing high-speed operability of the SRAM 15 regardless of a state of data previously stored in the SRAM 15. In the non-volatile SRAM memory cell 2, the first switch transistor 18a and the second switch transistor 18b can be independently turned, on and off. Thus, the respective threshold voltages of the first memory cell 17a and the second memory cell 17b, which are paired with each other, can be independently monitored.

Furthermore, in the non-volatile SRAM memory cell 2, the first storage node SNT and the second storage node SNB are made to match the reset voltage Vss, and the monitoring of the threshold voltage Vth is then started. When the threshold voltage Vth is monitored using the reference current Iref, therefore, high-accuracy monitoring can be performed without being affected by a variation in the voltages at the first storage node. SNT and the second storage node SNB. In the non-volatile SRAM memory cell 2, the operation and the reliability of the non-volatile memory unit 16 can be reliably ensured by setting the reference current Iref and the voltage on the memory gate line MG1, as needed.

If the threshold voltage Vth is monitored by determining whether the reference current Iref flows with the measurement voltage Vmonitor, an operation for latching the SRAM 15 and an operation for reading out the respective voltages at the first storage node SIT and the second storage node SIB can be collectively performed for each of the power supply lines VSp0, VSp1, VSp2, and VSp3. While a case where the threshold voltage Vth of the second memory cell 17b is monitored has been described in the above described embodiment, she present invention is not limited so this. When the first switching transistor 18a and the first switch transistor 18a are turned on, the threshold voltage Vth of the first memory cell 17a can also be similarly monitored.

While a case where the voltage on the power supply line VSp1 in the SRAM 15 is lowered to stop the function of latching the SRAM 15 has been described in the above described embodiment, the present invention is not limited to this. The voltage on the reference voltage line VSn1 may be raised to stop the function of latching the SIAM 15. While a method for setting each of the voltages on she complementary first bit line BLT1 and the complementary second bit line BLB1 to 0 [V] when the function of latching the SRAM 15 is stopped has been described in the above described embodiment, the present invention is not limited to this. The respective voltages on the complementary first bit line. BLT1 and the complementary second bit line BLB1 may be made to match the power supply voltage VDD.

While a case where the memory current Imem in the second memory cell 17b and the reference current Iref, which is supplied to the second storage node SIB, connected to the second memory cell 17b are compared with each other has been described in the above described embodiment, the present invention is not limited to this. For example, a method for electrically connecting one of the storage nodes (either one of the first storage node SIT and the second storage node SIB) with the non-volatile memory unit 16, electrically connecting' the other storage node (the other one of the first storage node SIT and the second storage node SIB) with the bit line control circuit. 5, and comparing the memory current Imem flowing through the storage node connected with the non-volatile memory unit 16 and the reference current Iref flowing through the other storage node may be used. If a method includes comparing the memory current Imem and the reference current Iref and determining data to latch the SRAM 15 depending on which of the memory current. Imem and the reference current. Iref is larger, such method may be used.

(3) Operation and Effect

In the foregoing configuration, the non-volatile semiconductor memory device 1 according to the embodiment of the present invention is provided with the non-volatile SRAM memory cell 2 in which the SRAM 15 and the non-volatile memory unit 16 are connected to each other. The SRAM 15 includes the first load transistor 22a and the first drive transistor 23a having their respective one ends connected to each other and the first storage note SNT between the first load transistor 22a and the first drive transistor 23a, and the second load transistor 22b and the second drive transistor 23b having their respective one ends connected to each other and the second storage note SNB between the second load transistor 22b and the second drive transistor 23b. The respective ocher ends of the first load transistor 22a and the second load transistor 22b are connected to the power supply line VSp1, and the respective other ands of the first drive transistor 23a and the second drive transistor 23b are connected to the reference voltage line VSn1.

The SRAM 15 also includes the first access transistor 21a having its one end connected to the respective gates of the second load transistor 22b and the second drive transistor 23b and the first storage node SNT, its other end connected to the complementary first bit line BLT1 and its gate connected to the word line WM. Further, the SRAM 15 includes the second access transistor 21b having its one end connected to the respective gates of the first load transistor 22a and the first drive transistor 23a and the second storage node SNB, its other end connected to the complementary second bit line BLB1 and its gate connected to the word line WL1.

On the other hand, the non-volatile memory unit 16 includes the first memory cell 17a in which the first storage node SNT is connected to one end of the first switch transistor 18a connected in series with a first memory transistor 19a and the second memory cell 17b in which the second storage node SNB is connected to one end of the second switch transistor 18b connected in series with a second memory transistor 19b.

In the non-volatile semiconductor memory device 1, during a programming operation for programming SRAM data represented by a difference between the respective voltages as the first storage node SNT and the second storage node SNB in the SRAM 15 into the non-volatile memory unit 16, either one of the first switch transistor 18a and the second switch transistor 18b is turned on due to the difference between the respective voltages at the first storage node SNT and the second storage node SNB.

In the non-volatile memory unit 16, charge is injected into either one of respective floating gates FGa and FGb of the first memory transistor 19a and the second memory transistor 19b using source side injection utilizing a voltage difference and an on-current occurring either between the first switch transistor 18a and the first memory transistor 19a, which have been turned on, or between the second switch transistor 18b and the second memory transistor 19b, which have been turned on.

Thus, in the non-volatile SRAM memory cell 2, voltages respectively required for the programming operation and the programming inhibition operation in the non-volatile memory unit 16 can be lowered. As a result of this, the respective voltages at the first storage node SIT and the second storage node SIB applied to the non-volatile memory unit 16 to perform the programming operation and the programming inhibition operation in the non-volatile memory unit 16 can also be lowered.

Therefore, in the non-volatile SRAM memory cell 2, voltages respectively applied to the first access transistor 21a, the second access transistor 21b, the first load transistor 22a, the second load transistor 22b, the first drive transistor 23a, and the second drive transistor 23b constituting the SRAM 15 connected so she non-volatile memory unit 16 can be lowered, and accordingly, the thickness of a gate insulating film of each of the transistors can be set to 4 [nm] or less.

Therefore, in the non-volatile semiconductor memory device 1 including the non-volatile SRAM memory cells 2, the SRAM 15 can be operated at high speed with a low power supply voltage because the thickness of the gate insulating film of each of the first access transistor 21a, the second access transistor 21b, the first load transistor 22a, the second load transistor 22b, the first drive transistor 23a, and the second drive transistor 23b constituting the SRAM 15 can be set to 4 [nm] or less. Therefore, in the non-volatile semiconductor memory device 1, the SRAM data in the SRAM 15 can be programmed into the non-volatile memory unit 16 while a high-speed operation in the SRAM 15 can be implemented.

Furthermore, during the programming operation in the non-volatile memory unit 16, she respective potentials at the first storage node SNT and the second storage node SIB are 0 [V] or the power supply voltage VDD. Thus, a gate voltage required to turn on or off the first switch transistor 18a and she second switch transistor 18b may be the power supply voltage VDD or less. As a result, a voltage higher than the power supply voltage VDD is not required. Therefore, the respective gate insulating films of the first switch transistor 18a and the second switch transistor 18b can be set to 4 [nm] or less. Thus, in the non-volatile SRAM memory cell 2, the performances of the first switch transistor 18a and the second switch transistor 18b can be improved while the respective gate lengths thereof can be reduced because the gate insulating films of the first switch transistor 18a and the second switch transistor 18b can be set to 4 [nm] or less. Therefore, the writing of the memory data in the non-volatile memory unit 16 into the SRAM 15 can be speeded up while the cell size of the non-volatile memory unit 16 can be reduced.

The non-volatile semiconductor memory device 1 is provided with a data inversion circuit 4 for detecting the respective voltages at the first storage node SNT and the second storage node SNB via the complementary first bit line BLT1 and the complementary second bit line PLEA, then applying, so the first storage node SNT or the second storage node SNB to which a High-level voltage has been applied, a Low-level voltage obtained by logically inverting the High-level voltage while applying, to the second storage node SNB or the first storage node SNT to which a Low-level voltage has been applied, a High-level voltage obtained, by logically inverting the Low-level voltage during the programming operation for programming the SRAM data in the SRAM 15 into the non-volatile memory unit 16, and programming the SRAM data after the inversion into the non-volatile memory unit 16.

Thus, in the non-volatile SRAM memory cell 2, before the SRAM data is programmed into the non-volatile memory unit 16, the inverted data obtained by logically inverting the SRAM data is previously stored in the SRAM 15 and is programmed into the non-volatile memory unit 16 ("(2-5-2) Memory Data Writing Operation According to Second Embodiment").

Thus, in the non-volatile SRAM memory cell 2, when the memory data stored in the non-volatile memory unit 16 is written into the SRAM 15, the memory source line MS1 is set at 0 [V], and the first storage node SNT or the second storage node SNB on the side of the first memory transistor 19a or the second memory transistor 19b in a non-writing state where no charge is stored (threshold voltage Vth<0 [V]) can be connected to the memory source line MS1 at 0 [V].

Thus, in the non-volatile SRAM memory cell 2, the same Low-level voltage as that before the inversion can be applied to the first storage node SNT or the second storage node SNB to which the Low-level voltage has been applied before the inversion. Therefore, in the programming operation according to the second embodiment, the memory source line MS1 can be maintained at 0 [V] while the Low-level voltage of the non-volatile memory unit 16 can be fed into the SRAM 15 through the memory source line MS1. Thus, the programming operation becomes the same simple and stable operation as the writing operation performed to the SRAM. 15 from the outside. Therefore, a high-speed and low-voltage operation can be performed.

In the above described "(2-5-3) Memory Data Writing Operation According to Third Embodiment", the SRAM data in the SRAM 15 is not inverted during the programming operation for programming the SRAM data into the non-volatile memory unit 16 but is inverted after the memory data stored in the non-volatile memory unit 16 is written into the SRAM 15.

More specifically, when the memory data stored in the non-volatile memory unit 16 is written into the SRAM 15, a. Low-level voltage and a High-level voltage are respectively applied to the first storage node SNT and the second storage node SNB to latch the first storage node SNT and the second storage node SNB based on the presence or absence of charge injection at the floating gates FGa and FGb of the first memory transistor 19a and the second memory transistor 19b in the non-volatile memory unit 16, bit information (respective Low-level and High-level states of the first storage node SNT and the second storage node SNB) are then read out into the data inversion circuit 4 via the complementary first bit line BLT1 and the complementary second bit line BLT2, and a High-level voltage and a Low-level voltage obtained by logical inversion by the data inversion circuit 4 are respectively applied to the first storage node SNT and the second storage node SNB, to latch the first storage node SNT and the second storage node SNB.

Thus, in the memory data writing operation according to the third embodiment, the SRAM data in the SRAM 15 can be quickly programmed into the non-volatile memory unit 16 because the SRAM data is not inverted during the programming operation for programming the SRAM data in the SRAM 15 into the non-volatile memory unit 16 in addition to an effect of the memory data writing operation according to the above described second embodiment.

In the above described configuration, in the non-volatile semiconductor memory device 1, the voltages (voltages at the storage nodes) respectively required for the programming operation for programming the SRAM data into the non-volatile memory unit 16 and the programming inhibition operation for not programming the SRAM data into the non-volatile memory unit 16 can be lowered. Thus, the SRAM it can be operated at high speed with a low power supply voltage because the thickness of the gate insulating film of each of the first access transistor 21a, the second access transistor 21b, the first load transistor 22a, the second load transistor 22b, the first drive transistor 23a and the second drive transistor 23b constituting the SRAM 15 connected to the non-volatile memory unit 16 can be set to 4 [nm] or less. Therefore, the SPAIN data in the SRAM 15 can be programmed into the non-volatile memory unit 16 while a high-speed operation in the SRAM 15 can be implemented.

Figure 14:
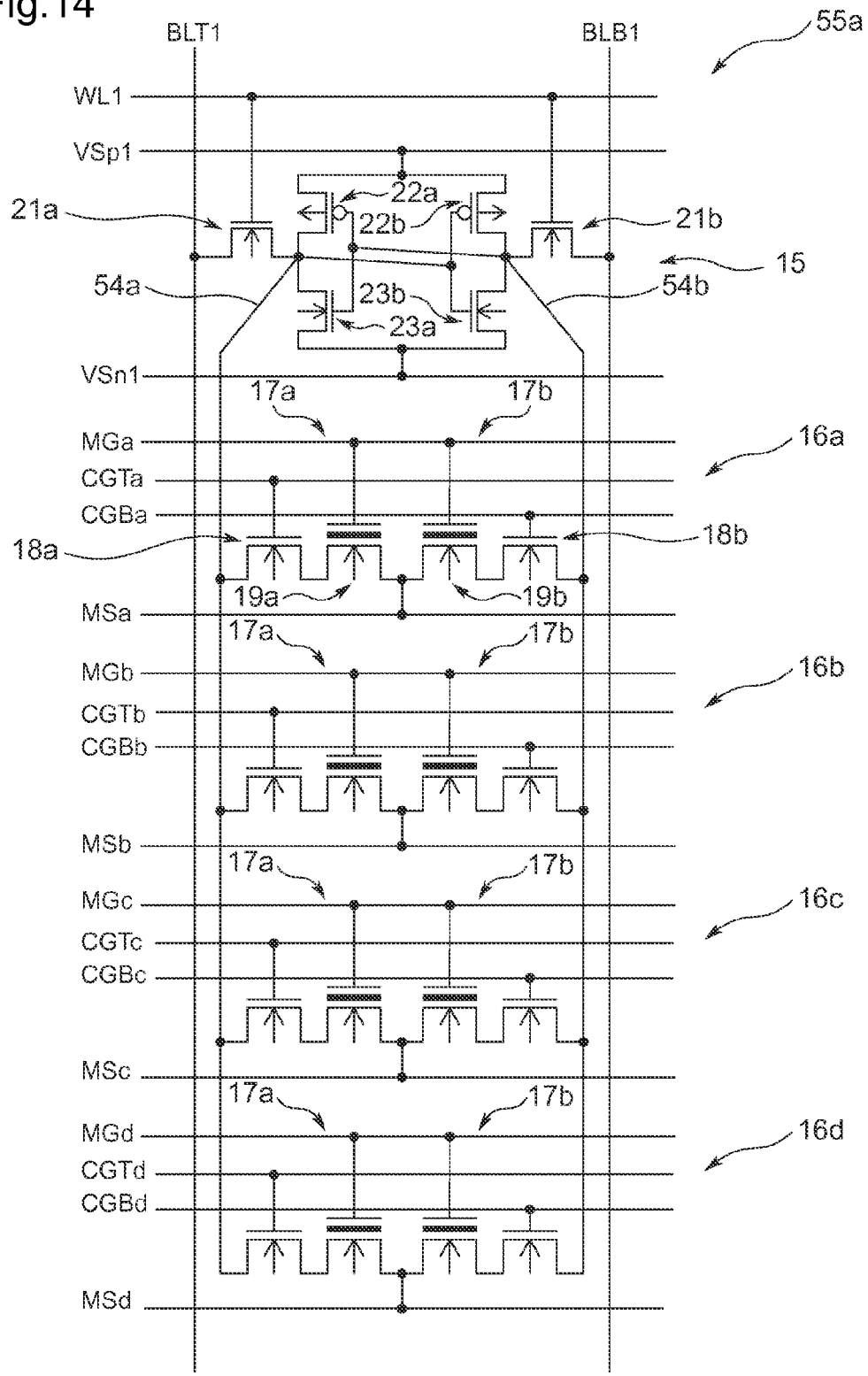
FIG. 14 is a schematic view illustrating a circuit configuration of a non-volatile SRAM memory cell according to another embodiment in which a plurality of non-volatile memory units are arranged in parallel.

(4) Other Embodiments (4-1) As to Non-Volatile SRAM Memory Cell to which a Plurality of Non-Volatile Memory Units are Connected in Parallel While the non-volatile SRAM memory cell 2 in which one non-volatile memory unit 16 is connected to one SRAM 15 has been described in the above described embodiments, the present invention is not limited to this. As illustrated in FIG. 14 in which units corresponding to those illustrated in FIG. 2 are assigned the same reference numerals, a non-volatile SRAM memory cell 55a in which a plurality of non-volatile memory units 16a, 16b, 16c, 16d are connected in parallel with one SRAM 15 may be used.

In the present embodiment, a first common wiring 54a is connected to a first storage node SNT while a second common wiring 54b is connected to a second storage node SNB. Each of the non-volatile memory units 16a, 16b, 16c, and 16d has a configuration in which a first switch transistor 18a has its one end connected to the first storage node SNT in the SRAM 15 via the first common wiring 54a and a second switch transistor 18b has its one end connected to the second storage node SNB in the SRAM 15 via the second common wiring 54b.

In the non-volatile SRAM memory cell 55a, memory gate lines MGa, MGb, MGc, and MGd and memory source lines MSa, MSb, MSc, and MSd are respectively provided for the non-volatile memory units 16a, 16b, 16c, and 16d, and a voltage required to program SRAM data can be applied to a first memory transistor' 19a and a second memory transistor 19b for each of the non-volatile memory units 16a, 16b, 16c, and 16d. Further, the non-volatile SRAM memory cell 55a includes first switch gate lines CGTa, CGTb, CGTc, and CGTd and second switch gate lines CGBa, CGBb, CGBc, and CGBd, respectively, for the non-volatile memory units 16a, 16b, 16c, and 16d. The first switch transistor 18a and the second switch transistor 18b are turned on or off for each of the non-volatile memory units 16a, 16b, 16c, and 16d.

Therefore, in the non-volatile SRAM memory cell 55a, only the non-volatile memory unit 16a, for example, optionally selected among the plurality of non-volatile memory units 16a, 16b, 16c, and 16d is connected to the SRAM 15 by turning on or off the first switch transistor 18a and the second switch transistor 18b so that the SRAM data stored in the first storage node SNT and the second storage node SNB in she SRAM 15 can be programmed into only the non-volatile memory unit 16a.

In the non-volatile SRAM memory cell 55a, only the non-volatile memory unit 16a, for example, optionally selected among the plurality of non-volatile memory units 16a, 16b, 16c, and 16d is connected to the SRAM 15 by turning on or off the first switch transistor 18a and the second switch transistor 18b so that the memory data stored in the non-volatile memory unit 16a can be written into the first storage node SNT and the second storage node SNB in the SRAM 15.

Figure 15:
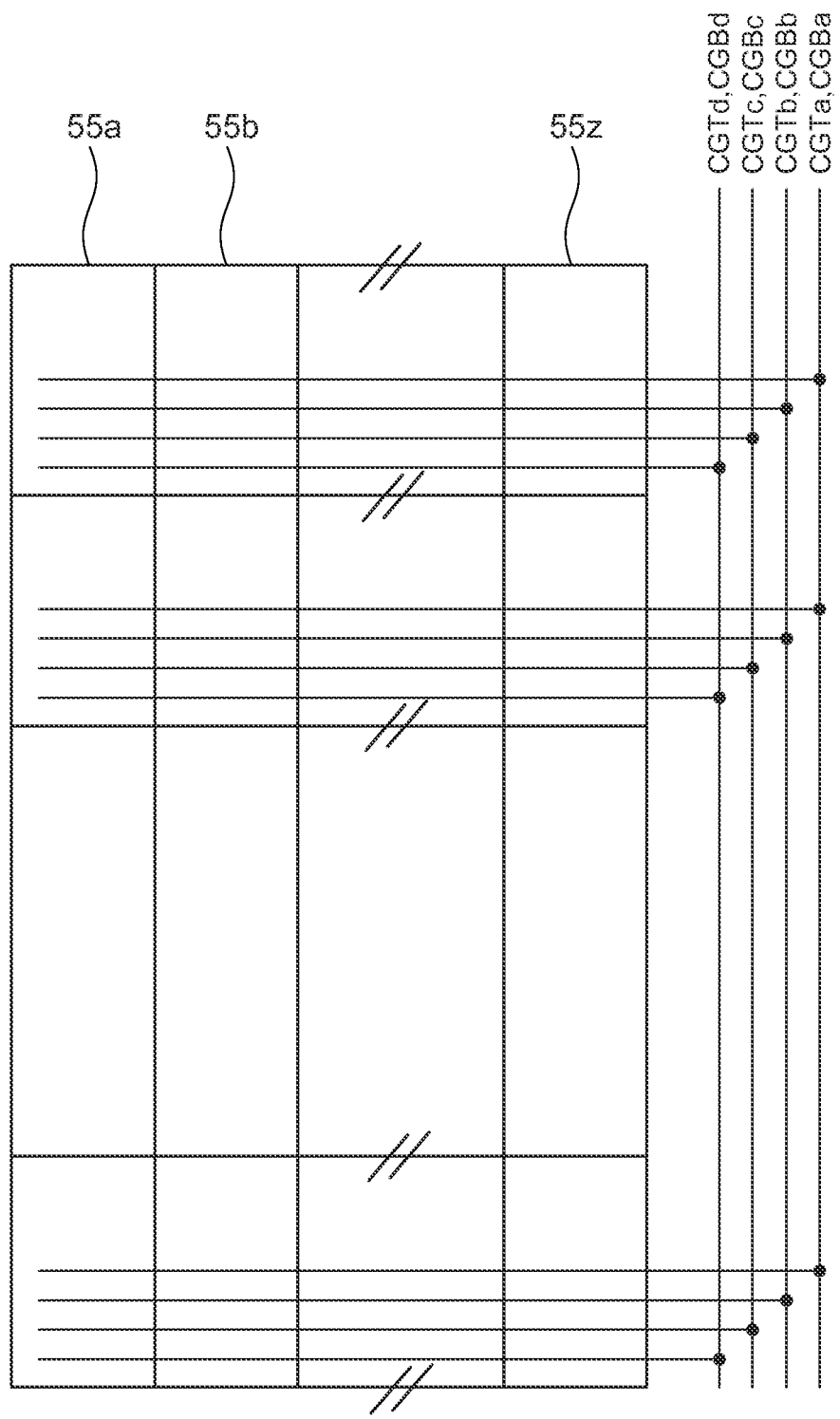
FIG. 15 is a schematic view illustrating respective states of first switch gate lines and second switch gate lines when a plurality of non-volatile SRAM memory cells illustrated in FIG. 14 are arranged.

FIG. 15 is a schematic view illustrating a case where a plurality of non-volatile SRAM memory cells 55a, 55b, . . . , 55z are provided. In this case, the non-volatile SRAM memory cells 55a, 55b, . . . , 55z share the first switch gate line CGTa and the second switch gate line CGBa in the non-volatile memory unit 16a in the first stage, for example, share the first switch gate line CGTb and the second switch gate line CGBb in the non-volatile memory unit 16b in the second stage, share the first switch gate line. CGTc and the second switch gate line CGBc in the non-volatile memory unit 16c in the third stage, and share the first switch gate line CGTd and the second switch gate line. CGBd in the non-volatile memory unit. 16d in the fourth stage, for example.

Thus, the non-volatile SRAM memory cells 55a, 55b, . . . , 55z can individually apply predetermined voltages, respectively, to the first switch gate line CGTa and the second switch gate line CGBa in the first stage, the first switch gate line CGTb and the second switch gate line CGBb in the second stage, the first switch gate line CGTc and the second switch gate line CGBc in the third stage, and the first switch gate line CGTd and the second switch gate line CGBd in the fourth stage, and can individually turn on or off the first switch transistors 18a and the second switch transistors 18b in the first to fourth stages for each of the stages. Thus, the non-volatile SRAM memory cells 55a, 55b, 55z can collectively write the memory data into all the respective SRAMs 15 for each of the non-volatile memory units 16a, 16b, 16c, and 16d in the first to fourth stages.

Figure 16A:
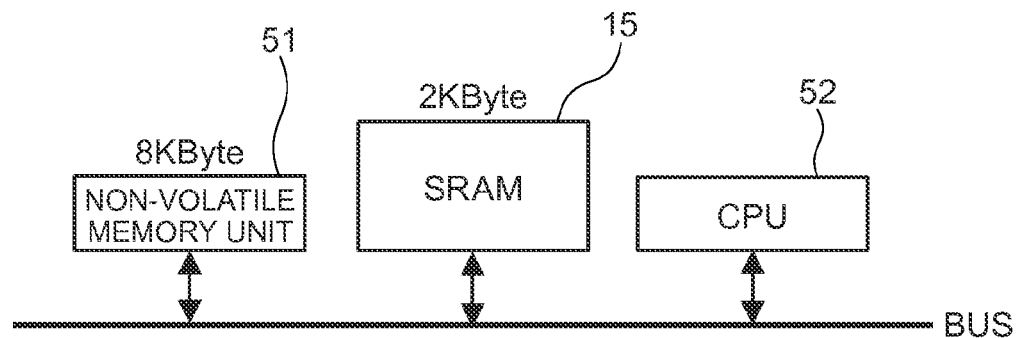
FIG. 16A is a schematic view illustrating a conventional circuit configuration in which a nonvolatile memory unit, an SRAM, and a. CPU are connected to one another via a bus.

A conventional circuit configuration including a large-capacity non-volatile memory unit and an SRAM includes a configuration in which a non-volatile memory unit 51 having a large capacity (e.g., 8 [KByte]), a CPU 52, and an SRAM 15 having a smaller capacity (e.g., 2 [KByte]) than that of the non-volatile memory unit 51 are connected to one another via a bus (BUS), as illustrated in FIG. 16A. In this conventional circuit configuration, when the memory data in the non-volatile memory unit 51 is written into the SRAM 15 in response to an instruction from a CPU 52, predetermined memory data needs to be read out of the non-volatile memory unit 51 and sent out to the SRAM 15 via the BUS.

When the SRAM data in the SRAM 15 is programmed into the non-volatile memory unit 51, the SRAM data needs to be sent out to the non-volatile memory unit 51 via the BUS and programmed into a designated predetermined region within the non-volatile memory unit 51. Therefore, in the conventional circuit configuration, the data needs to be sent or received via the BUS, or a required storage region needs to be selected from the large-capacity non-volatile memory unit 51. Thus, it takes time to exchange data wish the SRAM 15.

Figure 16B:
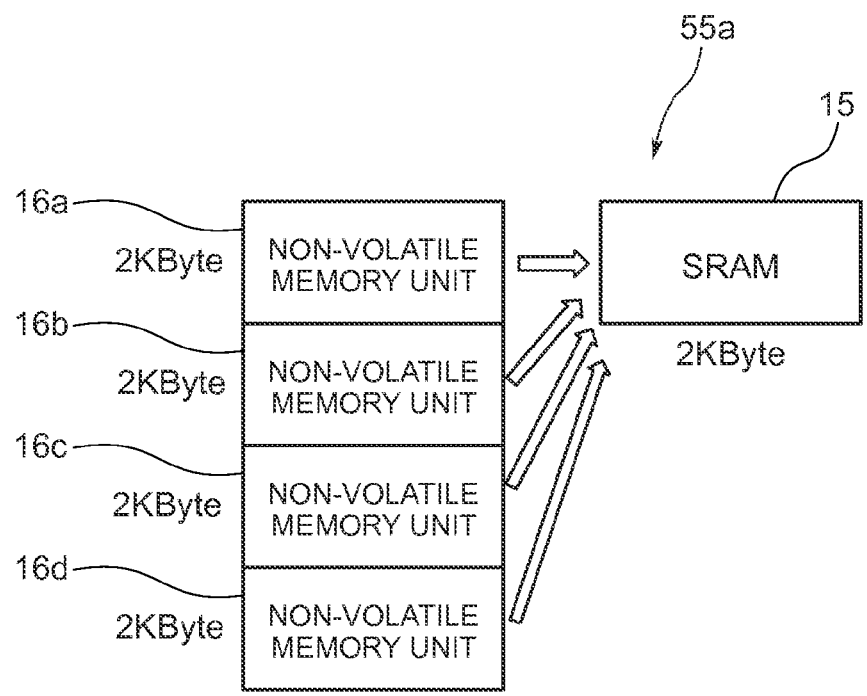
FIG. 16B is a schematic view provided for describing the non-volatile SRAM memory cell according to the embodiment of the present invention in which non-volatile memory units are arranged in parallel.

On the other hand, in the non-volatile SRAM memory cell 55a according to the present embodiment, the non-volatile memory units 16a, 16b, 16c, and 16d in the first to fourth stages are separated with the first switch transistor 18a and the second switch transistor 18b. Memory data can be collectively written into the SRAM 15 for each of the non-volatile memory units 16a, 16b, 16c, and 16d, as illustrated in FIG. 16B, by merely turning on or off the first switch transistor 18a and the second switch transistor 18b. Thus, in the non-volatile SRAM memory cell 55a, the non-volatile memory units 16a, 16b, 16c, and 16d can exchange data with the SRAM 15 in a shorter time than when required memory data is read out of the large-capacity non-volatile memory unit 51 and is written into the SRAM 15 via the BUS, like in the conventional example. The non-volatile SRAM memory cell 55a according to the present invention has a degree of freedom in selecting any one of the four non-volatile memory units 16a, 16b, 16c, and 16d during a programming operation and a memory data erasing operation in the non-volatile memory units 16a, 16b, 16c, and 16d and can generally perform a programming operation and a memory data erasing operation in a memory region (the non-volatile memory units 16a, 16b, 16c, and 16d) optionally selected by a user.

Figure 17:
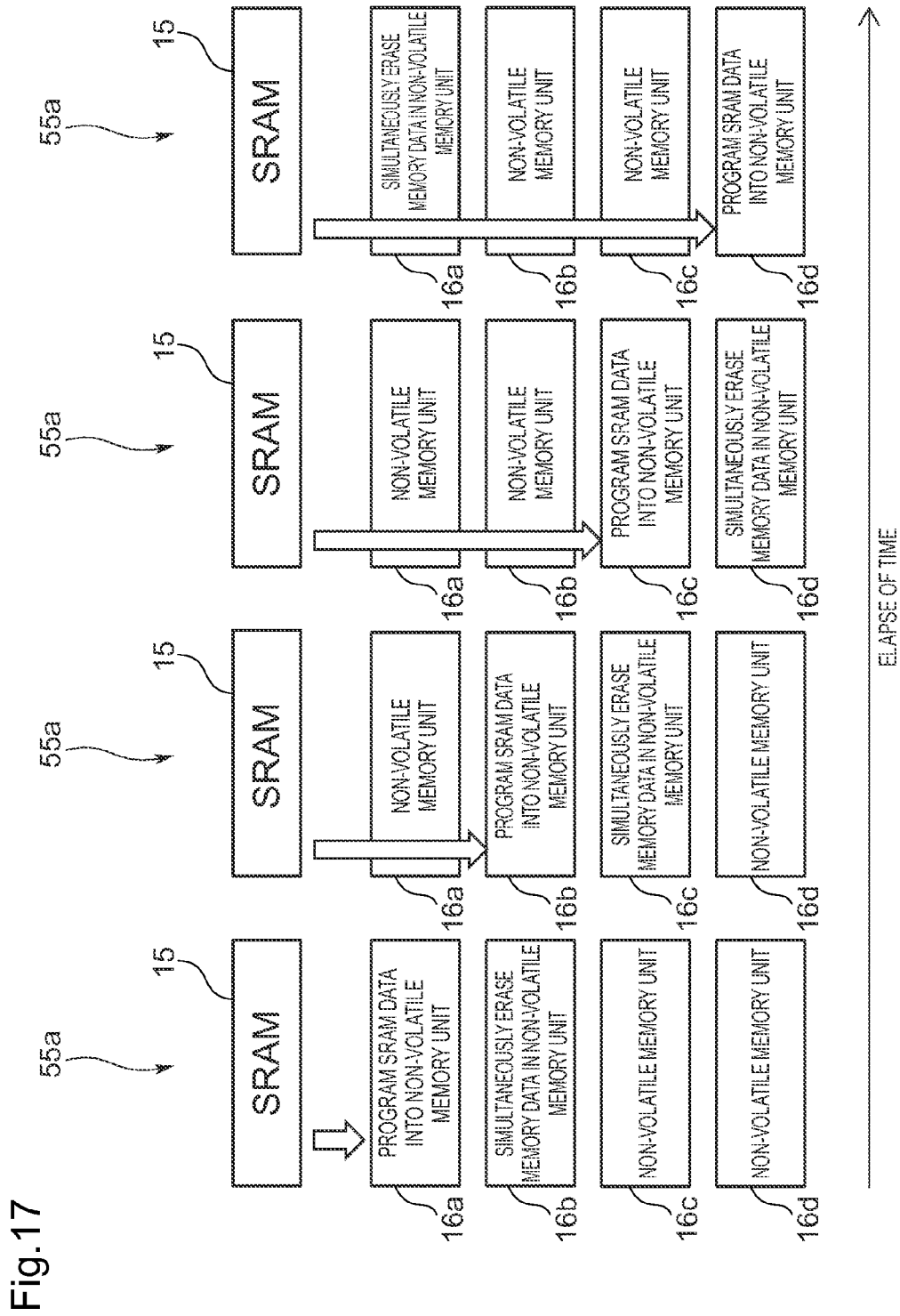
FIG. 17 is a schematic view provided for describing a programming operation and a memory data erasing operation using the non-volatile SRAM memory cells illustrated in FIG. 14.

Then, in the non-volatile SRAM memory cell 55a, a programming operation for programming SRAM data into the non-volatile memory units 16a, 16b, 16c, and 16d from the SRAM 15 and a memory data erasing operation for erasing memory data in the non-volatile memory units 16a, 16b, 16c, and 16d are efficiently performed to shorten time required for the programming operation and the memory data erasing operation, and a history of information to be stored can be stored, as described below. As illustrated in FIG. 17, the non-volatile SIAM memory cell 55a can first program the SRAM data in the SRAM 15 into the non-volatile memory unit 16a in the first stage and, simultaneously with the programming operation for programming the SRAM data, previously erase memory data in the non-volatile memory unit 16b in the second stage into which new SRAM data is to be then written.

In practice, in this case, in the non-volatile memory unit 16a in the first stage, the first switch transistor 18a and the second switch transistor 18b (FIG. 14) are turned on and can be electrically connected, respectively, to the first storage node. SNT and the second storage node SNB in the SIAM 15. At this time, in each of the other non-volatile memory units 16b, 16c, and 16d in the second to fourth stages, the first switch transistor 18a and the second switch transistor 18b are turned off, and can be electrically disconnected, respectively, from the first storage node SNT and the second storage node SNP: in the SRAM 15.

Thus, in the non-volatile SIAM memory cell 55a, the SRAM data in the SRAM 15 can be programmed into only the non-volatile memory unit 16a in the first stage. In the non-volatile memory unit 16b in the second stage, the memory gate line MGb and the memory source line MSb are provided separately from those in each of the other non-volatile memory units 16a, 16c, and 16d in the first, third, and fourth stages. When respective voltages on the memory gate line MGb and the memory source line MSb are adjusted, therefore, charge, which has been injected into either one of a floating gate FGa of the first memory transistor 19a and a floating gate FGb of the second memory transistor 19b, can be ejected, and the memory data can be erased.

In the non-volatile SRAM memory cell 55a, if new SRAM data, which has been written into the SRAM 15 from the outside, is to be then programmed into any one of the non-volatile memory units 16a, 16b, 16c, and 16d, the SRAM data is programmed into the non-volatile memory unit 16b in the second stage, from which the memory data has already been erased, among the plurality of non-volatile memory units 16a, 16b, 16c, and 16d. Also in this case, in the non-volatile SRAM memory cell 55a, the memory data in the non-volatile memory unit 16c in the third stage, into which new SRAM data is to be then programmed, can be previously erased.

In the non-volatile SRAM memory cell 55a, if new SRAM data, which has been written into the SRAM 15 from the outside, is to be then programmed into any one of the non-volatile memory units 16a, 16b, 16c, and 16d, the SRAM data is programmed into the non-volatile memory unit 16c in the third stage, from which the memory data has already been erased, among the plurality of non-volatile memory units 16a, 16b, 16c, and 16d, and at the same time the memory data in the non-volatile memory unit 16d in the fourth stage, into which new SRAM data is to be then programmed, can be previously erased. In the non-volatile SRAM memory cell 55a, if new SRAM data, which has been written into the SRAM 15 from the outside, is to be then programmed into any one of the non-volatile memory units 16a, 16b, 16c, and 16d, the SRAM data is programmed into she non-volatile memory unit 16d in the fourth stage, from which the memory data has already been erased, among the plurality of non-volatile memory units 16a, 16b, 16c, and 16d, and at the same time the memory data in the non-volatile memory unit 16a in the first stage, into which new SRAM data is to be then programmed, can be erased.

Thus, in the non-volatile SRAM memory cell 55a, when the SRAM data, which has been written into the SRAM 15 from the outside, is programmed into the non-volatile memory unit. 16a, for example, the memory data in the other non-volatile memory unit 16b associated with the non-volatile memory unit 16a is simultaneously erased, to always ensure the non-volatile memory unit 16b (16a, 16c, 16d) from which the memory data has been erased. Therefore, in the non-volatile SRAM memory cell 55a, time required to write the SRAM data can be shortened because the SRAM data can be more immediately programmed into the non-volatile memory unit 16b than if erasure of the memory data in the non-volatile memory unit 16b is started when the SRAM data is programmed into the non-volatile memory unit 16b in the second stage, for example. Further, in the non-volatile SRAM memory cell 55a, SRAM data corresponding to three generations in the past, for example, can also be respectively stored as memory data in the non-volatile memory units 16a, 16b, and 16c for each of she generations. Thus, the data corresponding to the generations in the past, which are respectively stored in the non-volatile memory units 16a, 16b, and 16c, can also be read out into the SRAM 15, as needed.

While a case where the non-volatile memory units 16a, 16b, 16c, and 16d arranged in the four stages are applied has been described in the above described embodiment, the present invention is not limited to this. Non-volatile memory units arranged in a plurality of stages such as two stages, three stages or more than four stages may be applied.

Figure 18:
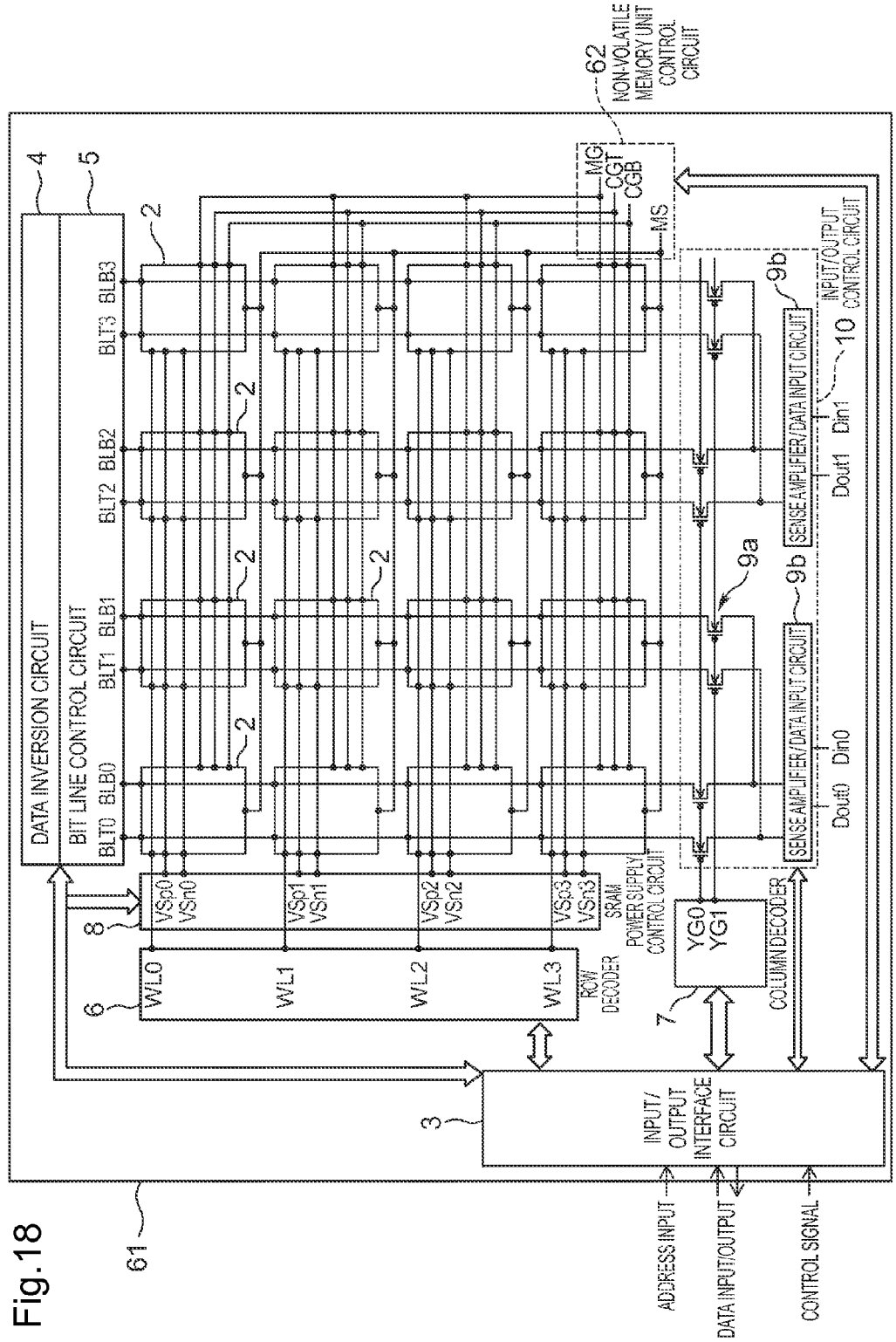
FIG. 18 is a schematic view illustrating a circuit configuration of a non-volatile semiconductor memory device according to another embodiment.

(4-2) As to Non-Volatile Memory Unit Control Circuit According to Other Embodiment While the non-volatile semiconductor memory device 1 including the non-volatile memory unit control circuit 11 in which the memory gate lines MG0, MG1, MG2, and MG3, the first switch gate lines CGT0, CGT1, CGT2, and CGT3, the second switch gate lines CGB0, CGB1, CGB2, and CGB3, and the memory source lines MS0, MS1, MS2, and MS3 are provided by the row for the non-volatile SRAM memory cells 2 arranged in a matrix shape, and the predetermined voltage is applied by the row to the memory gate lines MG0, MG1, MG2, and MG3, the first switch gate lines CGT0, CGT1, CGT2, and CGT3, the second switch gate lines CGB0, CGB1, CGB2, and CGB3, and the memory source lines MS0, MS1, MS2, and MS3 has been described, as illustrated in FIG. 1 in the above described embodiment, the present invention is not limited to this. As illustrated in FIG. 18 in which units corresponding so those illustrated in FIG. 1 are assigned the same reference numerals, a non-volatile semiconductor memory device 61 including a non-volatile memory unit control circuit 62 in which a common memory gate line MG, a common first switch gate line CGT, a common second switch gate line CGB, and a common memory source line MS are provided for non-volatile SRAM memory cells 2 arranged in a matrix shape, and a predetermined voltage is collectively applied to the memory gate line MG, the first switch gate line CGT, the second switch gate line CGB, and the memory source line MS may be used.

While all parts of the SRAM 15 can be controlled at a power supply voltage VDD or less, the non-volatile memory unit 16 requires a relatively high voltage to perform a programming of SRAM data. Thus, it is effective from the viewpoint of reducing a module size and simplifying a programming operation that the non-volatile memory unit control circuit, which controls the non-volatile memory unit 16 by supplying a voltage thereto, can be made as simple as possible. In this respect, in the non-volatile semiconductor memory device 61 illustrated in FIG. 18, the non-volatile memory unit control circuit 62 can collectively control all the common memory gate line MG, first switch gate line CGT, second switch gate line CGB, and memory source line MS within a mat. Thus, control by the row is not required, unlike in the non-volatile semiconductor memory device 1 illustrated in FIG. 1. Therefore, in the non-volatile semiconductor memory device 61, small-area and simple control can be implemented because the number of non-volatile memory unit control circuits 62 within the mat may be one. Further, a programming operation and a memory data erasing operation can be collectively performed for each memory mat. Therefore, time required for the programming operation and the memory data erasing operation can be shortened.

(4-3) As so Non-Volatile Memory Unit According to Other Embodiment

While the second memory cell 17b having a configuration in which the second switch transistor 18b including the switch gate electrode 40 and the second memory transistor 19b including the memory gate electrode 39 are adjacent to and connected to each other in series and, during a programming operation of SRAM data, injecting charge into the floating gate FGb using source side injection has been described, as illustrated in FIG. 4A, in the above described embodiment, the present invention is not limited to this. First memory cells and second memory cells having various configurations may be applied if charge can be injected into floating gates using source side injection during a programming operation of SRAM data.

Figures 19A, 19B:
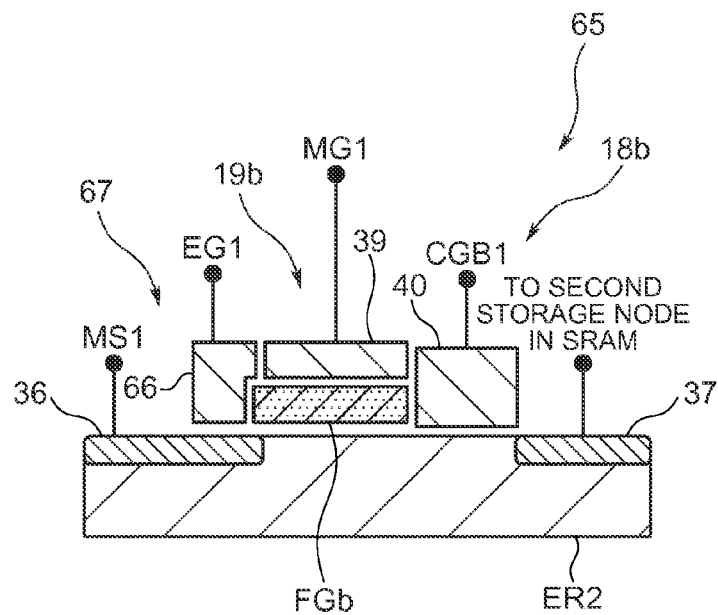
FIG. 19A is a schematic view illustrating a cross-sectional, configuration (1) of a second memory cell according to the other embodiment.
Figures 20A, 20B:
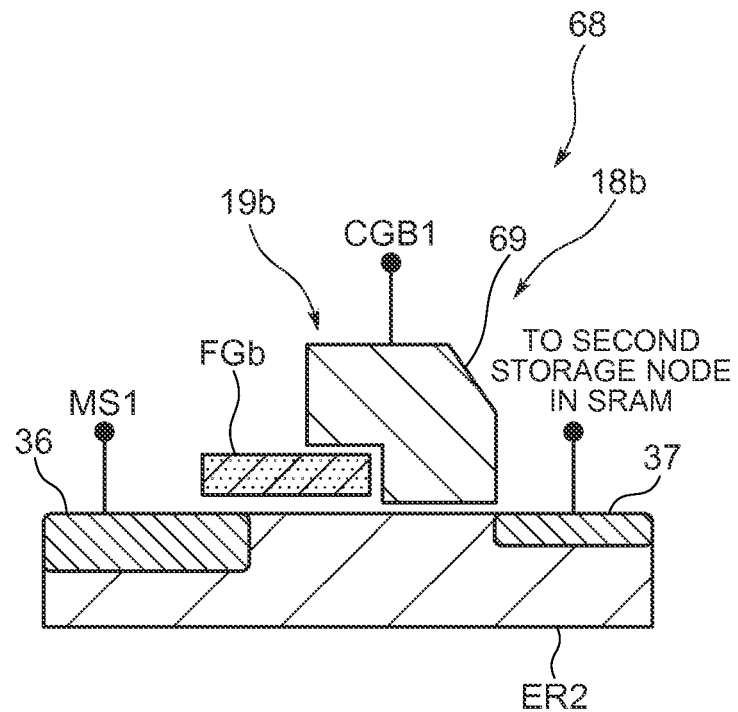
FIG. 20A is a schematic view illustrating a cross-sectional configuration (2) of a second memory cell according to the other embodiment.
Figures 21A, 21B:
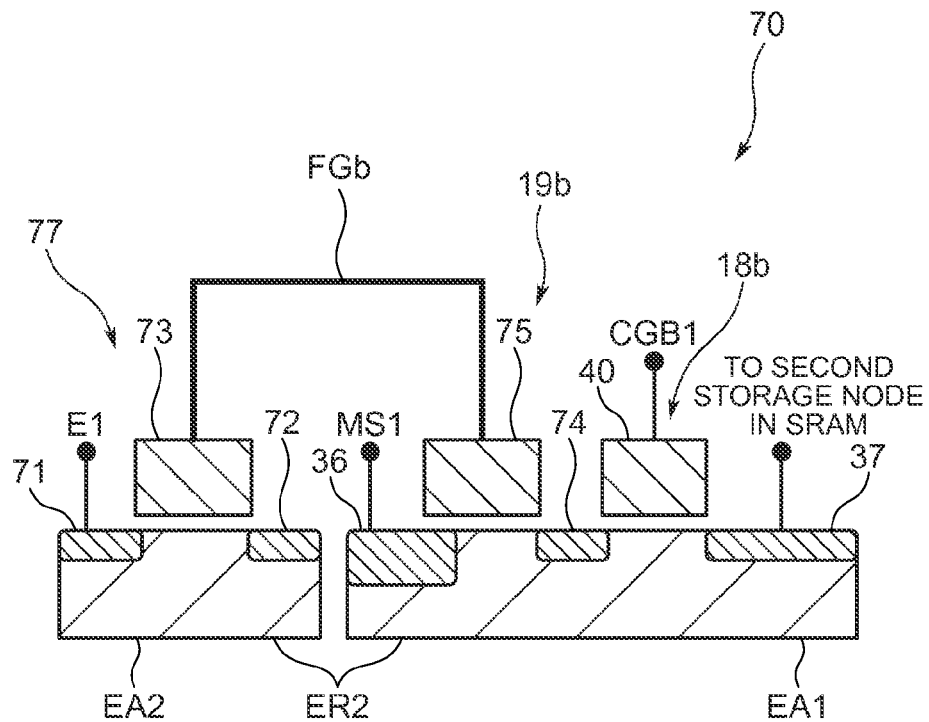
FIG. 21A is a schematic view illustrating a cross-sectional configuration (3) of a second memory cell according to the other embodiment.
FIG. 21B is a table illustrating respective voltage values at each site during a programming operation and during a memory data erasing operation.

A second memory cell according to the other embodiment is illustrated below in FIGS. 19A, 20A, and 21A. FIGS. 19A, 20A, and 21A are schematic views paying attention to the second memory cell, to match FIG. 4A. A first memory cell, together with the second memory cell, constituting a non-volatile memory unit has the same configuration as that of the second memory cell, and hence description thereof is not repeated.

(4-3-1) Non-Volatile Memory Unit Including First Memory Cell and Second Memory Cell Including Erase Transistor FIG. 19A in which units corresponding to those illustrated in FIG. 4A are assigned the same reference numerals is a schematic view illustrating a cross-sectional configuration of a second memory cell 65 according to the other embodiment. In this case, in the second memory cell 65, an erase gate electrode 66 is arranged to cover a side surface of a memory gate electrode 39 and a corner part at an upper end of a side surface of a floating gate FGb on a source-drain region 36 connected to a memory source line MS1, to form an erase transistor 67. An erase gate line EG1 is connected to the erase gate electrode 66, and a predetermined voltage can be applied thereto via the erase gate line EG1.

The erase gate line EG1 is shared between a first memory cell (not illustrated) and the second memory cell 65, and a predetermined voltage can be uniformly applied to the first memory cell and the second memory cell 65. The erase gate line EG1 is provided, when non-volatile SRAM memory cells 2 are arranged in a matrix shape, as illustrated in FIG. 1, for each row of non-volatile SRAM memory cells 2, and the non-volatile memory unit control circuit 11 can uniformly apply a predetermined voltage to the non-volatile memory units by the row.

FIG. 19B corresponding to FIG. 4B illustrates an example of respective voltages at sites when a non-volatile memory unit including the second memory cell 65 illustrated in FIG. 19A and the first memory cell having the same configuration as that of the second memory cell 65 is used. "Program (sram to flash)" illustrated in FIG. 19I indicates the respective voltages at the sites during a programming operation for programming SRAM data into the non-volatile memory unit from the SRAM 15, and "Erase (reset data in flash)" indicates the respective voltages at the sites during a memory data erasing operation in the non-volatile memory unit, "Write (external data to sram)" indicates the respective voltages at the sites during an external data writing operation for writing external data to the SRAM 15 from the outside, and "Read (output sram data)" indicates the respective voltages at the sites during a data reading operation from the SRAM 15.

In this case, during the programming operation, 10 [V] is applied to a memory gate line MG1, and 6 [V] is applied to each of the memory source line MS1 and the erase gate line EG1, for example. Thus, in the non-volatile memory unit, when a second storage node SNB is at a Low-level, for example, charge can be injected into the floating gate FGb using source side injection caused by a current flowing through an intense electric field region between a second memory transistor 19*b* and a second switch transistor 18*b* in the non-volatile memory unit connected to the second storage node SNB, like in "(2-3) Programming operation for Programming SRAM Data into Non-volatile Memory Unit from SRAM". When a first storage node SNT is at a Low-level, charge can be injected into a floating gate FGa using source side injection caused by a current flowing through an intense electric field region between a first memory transistor 19*a* and a first switch transistor 18*a* in a non-volatile memory unit connected to the first storage node SNT, which is not illustrated in FIG. 19A.

During the memory data erasing operation, 0 [V] can be applied to each of the memory gate line MG1 and the memory source line MS1 while 12 [V] can be applied to the erase gate line EG1, for example. Thus, in the second memory cell 65 in which charge is stored in the floating gate FGb, for example, electrons can be emitted into the erase transistor 67 from the floating gate FGb, and the memory data can be erased.

(4-3-2) Non-Volatile Memory Unit Including First Memory Cell and Second Memory Cell Having Shared Gate Electrode FIG. 20A in which units corresponding to those illustrated in FIG. 4A are assigned the same reference numerals is a schematic view illustrating a crass-sectional configuration of a second memory cell 68 according to the other embodiment. In this case, in the second memory cell 68, one shared gate electrode 69 that shares a gate electrode of a second switch transistor 18*b* and a date electrode of a second memory transistor 19*b* is provided on a second semiconductor region ER2 between source-drain regions 36 and 37, and a second switch gate line CGB1 is connected to the shared gate electrode 69.

In practice, in the second memory cell 68, the shared gate electrode 69 is provided on the second semiconductor region ER2 to be adjacent to the source-drain region 37, and the second switch transistor 18*b* can be formed between the source-drain region 37 and a floating gate FGb. The second memory transistor 19*b* using the floating gate FGb as its gate can be formed between the second switch transistor 18*b* and the source-drain region 36.

Furthermore, the shared gate electrode 69 is formed to cover a corner part at an upper end of a sidewall of the floating gate FGb so that electrons can be emitted due to an intense electric field in the corner part of the floating gate when a predetermined voltage is applied to the second switch gate line CGB1, and the shared gate electrode 69 covering the corner part can be formed as an erase element. The second memory cell 68 has no electrode corresponding to a memory gate electrode 39 (FIGS. 4A and 19A). However, the second memory cell 68 has a region in which the source-drain region 36 and the floating gate FGb overlap each other with a gate insulating film sandwiched therebetween so that a potential at the floating gate FGb can be controlled with a potential, on the memory-source line MS1 due to capacitive coupling. Thus, a function of the memory gate electrode 39 is compensated for.

FIG. 20B corresponding to FIG. 4B illustrates an example of respective voltages at sites when a non-volatile memory unit including the second memory cell 68 illustrated in FIG. 20A and a first memory cell (not illustrated) having the same configuration as that of the second memory cell 68 is used. In this case, during a programming operation illustrated in "Program (sram to flash)" in FIG. 20B, a power supply voltage VDD is applied to each of a first switch gate line CGT1 and the second switch gate line CGB1 while 10 [V] is applied to the memory source line PSI, for example.

At this time, in the second memory cell 68, a potential at the floating gate FGb rises due to capacitive coupling occurring in the region where the source-drain region 36 and the floating gate FGb overlap each other, a channel of the second memory transistor 19*b* is turned on. Thus, most of a potential on the memory source line. MS1 can be transmitted to the vicinity of a boundary between the second memory transistor 19*b* and the second switch gate line CGB1.

Thus, in the non-volatile memory unit, when a second storage node. SNB is at a Low-level, for example, charge can be injected into the floating gate FGb using source side injection caused by a current flowing through an intense electric field region between the second memory transistor 19*b* and the second switch transistor 18*b* in the non-volatile memory unit connected to the second storage node SNB, like in "(2-3) Programming Operation for Programming SRAM Data into Non-volatile Memory Unit from SRAM". When a first storage node SNT (not illustrated in FIG. 20A) is at a Low-level, charge can be injected into a floating gate FGa using source side injection caused by a current flowing through an intense electric field region between a first memory transistor 19*a* and a first switch transistor 18*a* in a non-volatile memory unit connected to the first storage node SNT.

During a memory data erasing operation illustrated in "Erase (reset data in flash)", 12 [V] can be applied to the first switch gate line CGT1 and the second switch gate line CGB1 while 0 [V] can be applied to the memory source line MS1, for example. Thus, in the second memory cell 68 in which charge is stored in the floating gate FGb, for example, charge (electrons) can be emitted into the second switch oate line CGB1 from the floating gate FGb, and memory data can be erased.

(4-3-3) Non-Volatile Memory Unit Including First Memory Cell and Second Memory Cell Respectively Having Erase Transistors Separately Formed FIG. 21A in which units corresponding to those illustrated in FIG. 4A are assigned the same reference numerals as a schematic view illustrating a cross-sectional configuration of a second memory cell 70 according to the other embodiment. In this case, the second memory cell 70 has a source-drain region 74 between a switch gate electrode 40 in a second switch transistor 18*b* and a memory gate electrode 75 in a second memory transistor 19*b*, the second switch transistor 18*b* and the second memory transistor 19*b* share the source-drain region 74, and the second switch transistor 18*b* and the second memory transistor 19*b* are arranged in series. In practice, in the second memory transistor 19*b*, the memory gate electrode 75 serving as a floating gate FGb is formed over the source-drain regions 36 and 74 and a part of the source-drain region 36 with a gate insulating film sandwiched therebetween.

An erase transistor 77 is formed in the second memory cell 70. The erase transistor 77 has a transistor configuration of the same conductivity type as that of the second switch transistor 18*b* and the second memory transistor 19*b*, and all the erase transistor 77, the second switch transistor 18*b*, and the second memory transistor 19*b* are formed in a second semiconductor region ER2. In this case, in the second semiconductor region ER2, a second active region EA2 is formed apart from a first active region EA1 where the second switch transistor 18*b* and the second memory transistor 19b are formed, and the erase transistor 77 is formed in the second active region EA2.

In practice, in the erase transistor 77, source-drain regions 71 and 72 are formed apart from each other on the second active region EA2, and an erase line E1 is connected to at least the source-drain region 71 at its one end. An erase gate electrode 73 serving as the floating gate FGb is formed on the second active region EA2 between the source-drain regions 71 and 72 with a gate insulating film sandwiched therebetween, and the erase gate electrode 73 is connected to the memory gate electrode 75 in the second memory transistor 19b.

FIG. 21B corresponding to FIG. 4B illustrates an example of respective voltages at sites when a non-volatile memory unit including the second memory cell 70 illustrated in FIG. 21A and a first memory cell (not illustrated) having the same configuration as that of the second memory cell 70 is used. In this case, during a programming operation illustrated in "Program (sram to flash)" in FIG. 21B, a power supply voltage VDD is applied to each of a first switch gate line CGT1 and a second switch gate line CGB1 while 10 [V] is applied to a memory source line MS1, for example. Further, 0 [V] is applied to the erase line E1.

Thus, in the non-volatile memory unit, when a second storage node SNB is at a. Low-level, for example, charge can be injected into the floating gate FGb using source side injection caused by a current flowing through an intense electric field region between the second memory transistor 19b and the second switch transistor 18b in the non-volatile memory unit connected to the second storage node SNB, like in "(2-3) Programming Operation for Programming SRAM Data into Non-volatile Memory Unit from SRAM". When a first storage node SNT (not illustrated in FIG. 21A) is at a Low-level, charge can be injected into a floating gate FGa using source side injection caused by a current flowing through an intense electric field region between a first memory transistor 19a and a second switch transistor 18a in a non-volatile memory unit connected to the first storage node SNT.

During a memory data erasing operation illustrated in "Erase (reset data in flash)", 0 [V] can be applied to each of she first switch gate line CGT1, the second switch gate line CGB1, and the memory source line MS1 while 10 [V] can be applied to the erase line E1, for example. Thus, in the second memory cell 70 in which charge is stored in the floating gate FGb, for example, electrons can be emitted to or holes can be injected into the floating gate FGb from the memory source line MS1 side, and memory data can be erased.

While in description of the memory data erasing operation according to the present invention, a case where a high voltage is applied to a diffusion layer to perform the memory data erasing operation has been described, the present invention is established in that an SRAM can be formed of a thin film transistor because a voltage in the SRAM to be applied to the non-volatile memory unit can also be lowered by programming data into the non-volatile memory unit using source side injection. Accordingly, the memory data erasing operation and its method are not essential. Therefore, the memory data erasing operation may include various erasing systems for efficiently transmitting an erase voltage to a floating gate using a coupling capacitor connected to the floating gate to accelerate the erasing operation and an erasing system using diffusion layers of different conductivity types.

In the present invention, respective configurations of the second memory cells 65, 68, and 70 illustrated in FIGS. 19A, 20A, and 21A may be combined to form a non-volatile memory unit, as needed. Alternatively, non-volatile memory units having each of the configurations may be connected in parallel with one SRAM to form a non-volatile SRAM memory cell, as illustrated in FIG. 14.

(4-3-4) Structure of Charge Storage Region of Non-Volatile Memory Unit

While a case where the floating gates FGa and Fab are used as a charge storage region indicating the presence or absence of writing of data depending on the presence or absence of storage of charge has been described in the above described embodiment, the present invention is not limited to this. A charge storage region of a discrete trap type, for example, may be used as a charge storage region obtaining a similar effect.

In this case, each of a first memory transistor and a second memory transistor each having the charge storage region of a discrete trap type has a configuration in which a charge storage region of a discrete trap type composed of a silicon nitride film or a compound of hafnium and silicon is provided on a semiconductor substrate (a second semiconductor region ER2) serving as a channel region with a gate insulating film sandwiched therebetween, for example, and a memory gate electrode is provided on the charge storage region with a gate insulating film, sandwiched therebetween. In this case, in each of the first memory transistor and the second memory transistor, a similar operation and effect to those in the above described embodiments can be obtained by adjusting the thickness of each of the gate insulating film between the charge storage region and the second semiconductor region ER2, the gate insulating film between the charge storage region and the memory gate electrode, and the charge storage region, as needed.

(4-4) Programming Operation According to Other Embodiment

In the above described embodiment, the non-volatile semiconductor memory device 1 in which the data inversion circuit. 4 is separately provided outside the complementary first bit lines BLT0, BLT1, BLT2, and BLT3 and the complementary second bit lines BLB0, BLB1, BLB2, and BLB3 has been described, as illustrated in FIG. 1. In the non-volatile semiconductor memory device 1, information stored in the non-volatile SRAM memory cell 2 needs to be converted into a potential relationship between the complementary first bit line BLT1 and the complementary second bit line BLB1, for example, to invert bit information, and respective information about the plurality of non-volatile SRAM memory cells 2 connected to the complementary first bit line Phil and the complementary second bit line BLB1 are difficult to invert at one time.

In the non-volatile semiconductor memory device according to the other embodiment of the present invention, logical inversion may be performed for each of the non-volatile SRAM memory cells 2 by switching a connection relationship between the first memory cell and the second memory cell and the first storage node SNT and the second storage node SNB within the non-volatile SRAM memory cell 2 during a programming operation for programming SRAM data stored in the SRAM 15 into the non-volatile memory unit 16 and a memory data writing operation for writing memory data stored in the non-volatile memory unit 16 into the SRAM 15.

In this case, in the non-volatile semiconductor memory device, processing for performing logical inversion outside the non-volatile SRAM memory cell 2 is not required. The programming operation and the memory data writing operation can be performed as one time by the plurality of non-volatile SRAM memory cells 2 connected to the complementary first bit line BLT1 and the complementary second bit line BLB1, for example, with all the word lines WL0, WL1, WL2, and WL3 turned off.

Figure 22A:
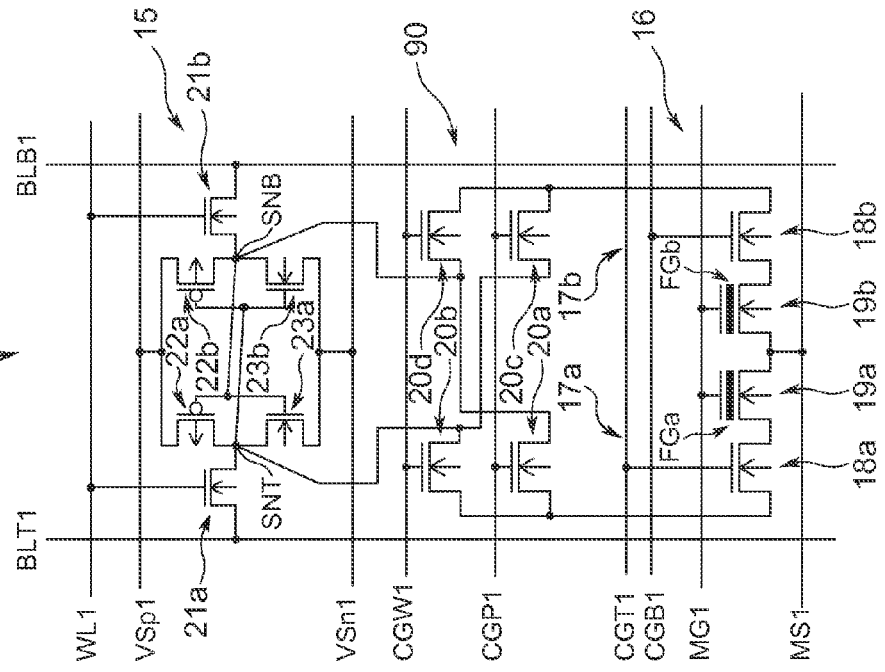
FIG. 22A is a schematic view illustrating a circuit configuration of a non-volatile SRAM memory cell in which a connection relationship of a first switch transistor and a second switch transistor with a first storage node and a second storage node is changed.
Figure 22B:
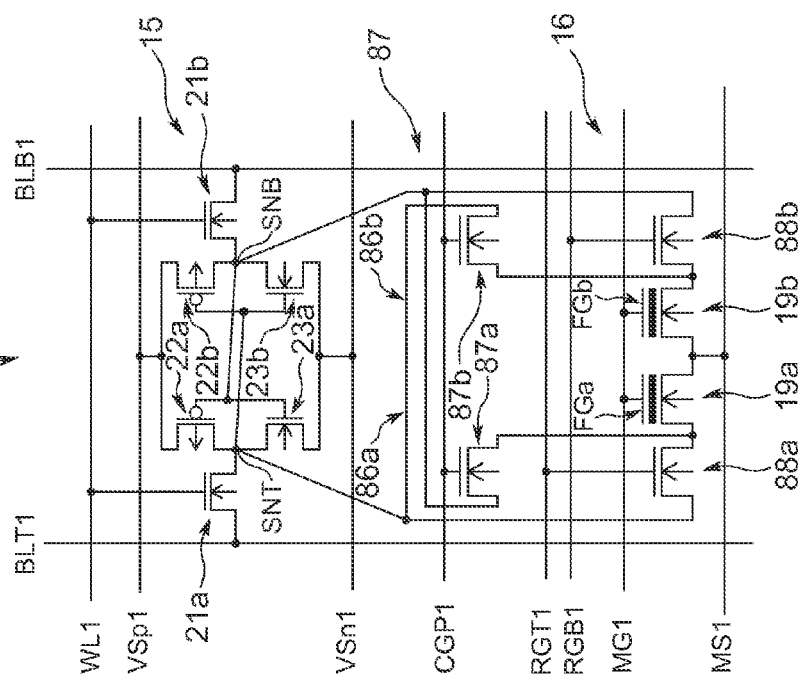
FIG. 22B is a schematic view illustrating a circuit configuration of a non-volatile SRAM memory cell provided with a switch mechanism.

Each of a non-volatile SRAM memory cell 85 illustrated in FIG. 22A and a non-volatile SRAM memory cell 95 illustrated in FIG. 22B can perform logical inversion between an SRAM 15 and a non-volatile memory unit 16 by switching a connection relationship between a first memory transistor 19a and a second memory transistor 19b and a first storage node SNT and a second storage node SNB, as needed, during a programming operation and a memory data writing operation without using the data inversion circuit 4 illustrated in FIG. 1.

In the non-volatile semiconductor memory device including the non-volatile SRAM memory cells 85 or 95, the data inversion circuit. 4 illustrated in FIG. 1 is not required. However, a similar effect to that of the data inversion circuit 4 is obtained. Further, a step of inverting bit information, described in "(2-5) Memory Data Writing Operation for Writing Memory Data in Non-volatile Memory Unit into SRAM" need not be independently provided. Thus, exchange of data between the SRAM 15 and the non-volatile memory unit 16 can be simplified.

In the non-volatile semiconductor memory device including the non-volatile SRAM memory cells 85 or 86, the programming operation from the SRAM 15 to the non-volatile memory unit 16 and the memory data writing operation from the non-volatile memory unit 16 to the SRAM 15 can be collectively performed in the entire memory mat. Thus, processing time can be significantly shortened. The non-volatile SRAM memory cells 85 and 95 will be individually described below.

(4-4-1) as to Non-Volatile SRAM Memory Cell in which Connection Configuration of First Switch Transistor and Second Switch Transistor with First Storage Node and Second Storage Node is Changed As illustrated in FIG. 22A in which units corresponding to those illustrated in FIG. 2 are assigned the same reference numerals, in the non-volatile SRAM memory cell 85, a non-volatile memory unit 16 includes a first memory cell 86a and a second memory cell 86b. In this case, the first memory cell 86a includes a first memory transistor 19a, an N-type MOS first switch transistor 87a connected in series with one end of the first memory transistor 19a, and an N-type MOS first reading transistor 88a connected in series with the one end of the first memory transistor 19a. The first memory cell 86a has a configuration in which the first switch transistor 87a connected in series with the first memory transistor 19a has its one end connected to a second storage node SNP) and the first reading transistor 88a connected in series with the one end of the first memory transistor 19a has its one end connected to a first storage node SNT.

On the other hand, the second memory cell 86b also has a similar configuration to the first memory cell 86a, and includes a second memory transistor 19b, a second switch transistor 87b connected in series with one end of the second memory transistor 19b, and a second reading transistor 88b connected in series with the one end of the second memory transistor 19b. The second memory cell 86b has a configuration in which the second switch transistor 87b connected in series with the second memory transistor 19b has its one end connected to a first storage node SNT and the second reading transistor 88b connected in series with the one end of the second memory transistor 19b has its one end connected to the second storage node SNB.

Furthermore, in this case, the first switch transistor 87a and the second switch transistor 87b have their respective gates connected to a common program gate line CGP1. In this case, the first reading transistor 88a has its gate connected to a first reading gate line RGT1 while the second reading transistor 88b has its gate connected to a second reading gate line RGB1 separately from the first reading gate line RGT1. The first reading transistor and the second reading transistor can be individually turned on or off by changing voltages respectively applied to the first reading gate line RGT1 and the second reading gate line RGB1.

In the non-volatile SRAM memory cell 85, in a programming operation for programming SRAM data into the non-volatile memory unit 16 from the SRAM 15, the first reading transistor 88a and the second reading transistor 88b are turned off by respectively applying to the first reading gate line RGT1 and the second reading gate line RGB1. In this case, a power supply voltage VDD is applied to the program gate line CGP1, a voltage of 6 [V] is applied to a memory source line MS1, and a voltage of 7 [V] is applied to a memory gate line MG1.

A case where the first storage node. SNT is at a Low-level and the second storage node SNB is at a High-level before the SRAM data is programmed into the non-volatile memory unit 16 will be described below. In this case, the first storage node SNT is at 0 [V]. Thus, the second switch transistor 87b connected to the first storage node SNT can be turned on. Therefore, a low voltage of 0 [V] at the first storage node SNT is applied to one end of the second memory transistor 19b via the second switch transistor 87b. As a result, charge can be injected into a floating gate FGb using source side injection.

In this case, the second storage node SNB is at the power supply voltage VDD. Thus, the first switch transistor 87a connected to the second storage node SNP: can be turned off. Therefore, the low voltage of 0 [V] is not applied to one end of the first memory transistor 19a and thus a data writing operation is not performed.

An operation for writing memory data into the SRAM 15 will be described below. In this case, 0 [V] is applied to the program gate line CGP1, to turn off the first switch transistor 87a and the second switch transistor 87b. The power supply voltage VDD is applied to each of the first reading gate line RGT1 and the second reading gate line RGB1, and 0 [V] is applied to the memory source line MS1. As a result, in the non-volatile SRAM memory cell 85, the first memory transistor 19a into which no data is written is turned on while the first reading transistor 88a is also turned on, and the first storage node SNT is connected to the memory source line MS1 at 0 [V] via the first reading transistor 88a and the first memory transistor 19a. When the SRAM. 15 is latched, therefore, the first storage node SNT enters a Low-level while the second storage node SNB enters a High-level. Thus, the initial SRAM data, which has not been programmed into the non-volatile memory unit 16, can be reproduced in the SRAM 15.

In the above described configuration, in the non-volatile SRAM memory cell 85, the first memory transistor 19a is connected to the first storage node SNT via the first reading transistor 88n and is connected to the second storage node SNB via the first switch transistor 87a while the second memory transistor 19b is connected to the second storage node SNB via the second reading transistor 88b and is connected to the first storage node SNT via the second switch transistor 87b.

In the non-volatile SRAM memory cell 85, during the programming operation for programming the SRAM data stored in the SRAM. 15 into the non-volatile memory unit 16, respective logics (a Low-level and a High-level) of the SRAM data at the first storage node SNT and the second storage node SNB can be inverted and programmed into the non-volatile memory unit 16 by turning on either one of the first switch transistor 87a and the second switch transistor 87b due to a difference between respective voltages at the first storage node SNT and the second storage node SNB and connecting the second memory transistor 19b to the first storage node SNT via the second switch transistor 87b that has been turned on or connecting the first memory transistor 19a to the second storage node SNB via the first, switch transistor 87a that has been turned on.

In the non-volatile SRAM memory cell 85, during the memory data writing operation for writing the memory data stored in the non-volatile, memory unit 16 into the SRAM 15, the same logic as a logic (a Low-level or a High-level) of the first memory transistor 19a can be directly written into the first storage node SNT while the same logic as a logic of the second memory transistor 19b can also be written into the second storage node SNB by turning on either one of the first memory transistor 19a and the second memory transistor 19b depending on the presence or absence of storage of charge in the first memory transistor 19a and the second memory transistor 19b and connecting the first: memory transistor 19a that has been turned on to the First storage node SNT via the first reading transistor 88a or connecting the second memory transistor 19b that has been turned on to the second storage node SNB via the second reading transistor 88b.

Thus, in the non-volatile SRAM memory cell 85, logical inversion processing outside the non-volatile SRAM memory cell 85 can be made unnecessary, and logical inversion processing can be performed for each of the non-volatile SRAM memory cell 85. Therefore, in the non-volatile SRAM memory cell 85, the programming operation from the SRAM 15 to the non-volatile memory unit 16 and the memory data writing operation from the non-volatile memory unit 16 to the SRAM 15 can be collectively performed in the entire memory mat. Hence, a processing time can be significantly shortened.

Also in this case, during the programming operation in the non-volatile memory unit 16, respective potentials at the first storage node SNT and the second storage node SNB are 0 [V] or the power supply voltage VDD. Thus, a gate voltage required to turn on or off each of the first switch transistor 87a, the second switch transistor 87b, the first reading transistor 88a, and the second reading transistor 88b may be the power supply voltage VDD or less. As a result, a voltage higher than the power supply voltage VDD is not required. Thus, a gate insulating film of each of the first switch transistor 87a, the second switch transistor 87b, the first reading transistor 88a, and the second reading transistor 88b can be set to 4 [nm] or less.

(4-4-2) as to Non-Volatile SRAM Memory Cell Provided with Switch Mechanism

FIG. 22B in which units corresponding to those illustrated in FIG. 2 are assigned the same reference numerals is a schematic view illustrating a non-volatile SRAM memory cell 95 provided with a switch mechanism 90. In the non-volatile SRAM memory cell 95, an SRAM 15 and a non-volatile memory unit 16 are connected to the switch mechanism 90, and the switch mechanism 90 can switch a connection relationship between a first memory cell 17a and a second memory cell 17b and a first storage node SNT and a second storage node SNB during a programming operation for programming SRAM data into the non-volatile memory unit 16 and a memory data writing operation for writing memory data into the SRAM 15 so that logical inversion can be performed within the non-volatile. SRAM memory cell 95.

In this case, the switch mechanism 90 includes an N-type MOS first selection transistor 20a and an N-type MOS second selection transistor 20b, which are paired with each other, connected to a first switch transistor 18a while including an N-type MOS third selection transistor 20c and an N-type MOS fourth selection transistor 20d, which are paired with each other, connected so a second switch transistor 18b, for example. The first selection transistor 20a provided on the side of the first memory cell. 17a and the third selection transistor 20c provided on the side of the second memory cell 17b have their respective gates connected to a common program gate line. CGP1, and a predetermined voltage can be uniformly applied thereto via the program gate line CGP1. Further, the third selection transistor 20c provided on the side of the first memory cell 17a and the fourth selection transistor 20d provided on the side of the second memory cell 17b have their' respective gates connected to the other write gate line CGW1 provided separately from the program gate line CGP1, and a predetermined voltage can be uniformly applied thereto via the write gate line CGW1.

The first selection transistor 20a provided on the side of the first memory cell 17s has its one end connected to one end of the first switch transistor 18a and one end of the second selection transistor 20b and its other end connected to the other end of the fourth selection transistor 20d and the second storage node SNP. The one end of the second selection transistor 20b, which is paired with the first selection transistor 20a, is connected to the one end of the first selection transistor 20a and the one end of the first switch transistor 18a, and the other end thereof is connected to the other end of the third selection transistor 20c and the first storage node SNT.

On the other hand, the third selection transistor 20c provided on the side of the second memory cell 17b has its one end connected to one end of the second switch transistor 18b and one end of the fourth selection transistor 20d and its other end connected so the other end of the second selection transistor 20b and the first storage node SNT. The one end of the fourth selection transistor 20d, which is paired with the third selection transistor 20c, is connected to the one end of she third selection transistor 20c and the one end of the second switch transistor 18b, and the other end thereof is connected to the other end of the first selection transistor 20a and the second storage node SNB.

More specifically, the first switch transistor 18a is connected to the second storage node SNB via the first selection transistor 20a while also being connected to the first storage node SNT via the second selection transistor 20b. The second switch transistor 18b is also connected to the first storage node SNT via the third selection transistor 20c while also being connected to the second storage node SNB via the fourth selection transistor 20d.

In the non-volatile SRAM memory cell. 95, during the programming operation for programming the SRAM data into the non-volatile memory unit 16 from the SRAM 15, a power supply voltage VDD can be applied to each of the program gate line CGP1, a first switch gate line CGT1, and a second switch gate line CGB1. In this case, in the non-volatile RPM memory cell 95, 0 [V] can be applied to a write gate line CGW1, and the second selection transistor 20b on the side of the first memory cell 17a and the fourth selection transistor 20d on the side of the second memory cell 17b can be turned off in this case, a voltage of 6 [V] can be applied to the memory source line MS1, and a voltage of 7 [V] can be applied to the memory gate line MG1.

A case where the first storage node SNT is at a Low-level and the second storage node SNB is at a High-level before the SRAM data is programmed into the non-volatile memory unit 16 will be described below. In this case, the first storage node SNT is at 0 [V]. Thus, the third selection transistor 20c connected to the first storage node SNT is turned on, and accordingly, the second switch transistor 18b connected to the third selection transistor 20c is also turned on. Thus, a low voltage of 0 [V] at the first storage node SNT is applied to one end of the second memory transistor 19b via the third selection transistor 20c and the second switch transistor 18b. As a result, charge can be injected into a floating gate FGb using source side injection.

In this case, the second storage node SNB is at the power supply voltage VDD. Thus, the first selection transistor 20a connected to the second storage node SNB can be turned off. The second selection transistor 20b is also turned off, as described above. Therefore, the low voltage of 0 [V] at the first storage node SNT can be cut off. Thus, in the memory transistor 19a, the low voltage of 0 [V] is not applied to its one end so that a data writing operation is not performed.

The operation for writing the memory data into the SRAM 15 will be described below. In this case, 0 [V] is applied to the program gate line CGP1, to turn off the first selection transistor 20a on the side of the first memory cell 17a and the third selection transistor 20c on the side of the second memory cell 17b. In this case, the power supply voltage VDD is applied to the write gate line CGW1, the first switch gate line CGT1, and the second switch gate line CGB1, and 0 [V] is applied to the memory source line MS1.

As a result, in the non-volatile SRAM memory cell 95, only the first memory transistor 19a into which no data has been written is turned on while the first switch transistor 18a and the second selection transistor 20b are also turned on. The first storage node SNT is connected to a memory source line MS1 at 0 [V] via the second selection transistor 20b, the first switch transistor 18a, and the first memory transistor 19a. When the SRAM 15 is latched, therefore, the first storage node SNT enters a Low-level while the second storage node SNB enters a. High-level. Thus, the initial SRAM data, which has not been programmed into the non-volatile memory unit 16, can be reproduced in the SRAM 15.

In the above described configuration, the non-volatile SRAM memory cell 95 is provided with the switch mechanism 90 for connecting the first storage node SNT to the first switch transistor 18a via the second selection transistor 20b and also to the second switch transistor 18b via the third selection transistor 20c while connecting the second storage node SNB to the second switch transistor 18b via the fourth selection transistor 20d and also to the first switch transistor 18a via the first selection transistor 20a.

In the non-volatile SRAM memory cell 95, during the programming operation for programming the SRAM data stored in the SRAM 15 into the non-volatile memory unit 16, the second selection transistor 20b and the fourth selection transistor 20d are turned off while either one of the first selection transistor 20a and the third selection transistor 20c is turned on due to a difference between respective voltages at the first storage node SNT and the second storage node SNB. Thus, in the non-volatile SRAM memory cell 95, respective logics (a Low-level and a High-level) of the SRAM data at the first storage node SNT and the second storage node SITE can be inverted and programmed into the non-volatile memory unit 16 by connecting the first memory transistor 19a to the second storage node SNB via the first selection transistor 20a that has been turned, on or connecting the second memory transistor 19b to the first storage node. SNT via the third selection transistor 20c that has been turned on.

In the non-volatile SRAM memory cell 95, during the memory data writing operation for writing the memory data stored in the non-volatile memory unit 16 into the SHAM 15, the first selection transistor 20a and the third selection transistor 20c are turned off while either one of the first memory transistor 19a and the second memory transistor 19b is turned on depending on the presence or absence of storage of charge in the first memory transistor 19a and the second memory transistor 19b. Thus, in the non-volatile SRAM memory cell 95, the same logic as a logic (a Low-level or a High-level) of the first memory transistor 19a can be directly written into the first storage node SNT while the same logic as a logic of the second memory transistor 19b can be written into the second storage node SNB by connecting the first memory transistor 19a that has been turned on to the first storage node SNT via the first switch transistor 18a and the second selection transistor 20b or connecting the second memory transistor 19b that has been turned on to the second storage node SNB via the second switch transistor 18b and the fourth selection transistor 20d. Thus, in the non-volatile SRAM memory cell 95, logical inversion processing outside the non-volatile SRAM memory cell 95 can be made unnecessary, and logic inversion processing can be performed for each of the non-volatile SRAM memory cells 95. Therefore, in the non-volatile SRAM memory cell 95, the programming operation from the SRAM 15 to the non-volatile memory unit 16 and the memory data writing operation from the non-volatile memory unit 16 to the SRAM 15 can be collectively performed in the entire memory mat. Accordingly, processing time can be significantly shortened.

Also in the above described embodiment, during the programming operation in the non-volatile memory unit 16, the respective potentials at the first storage node SNT and the second storage node SNB are 0 [V] or the power supply voltage VDD. Thus, a gate voltage required to turn on or off each of the first selection transistor 20a, the second selection transistor 20b, the third selection transistor 20c, and the fourth selection transistor 20d constituting the switch mechanism 88 may be the power supply voltage VDD or less, and a higher voltage than the power supply voltage VDD is not required to turn on or off the switch mechanism 88. Therefore, a gate insulating film of each of the first selection transistor 20a, the second selection transistor 20b, the third selection transistor 20c, and the fourth selection transistor 20d can be set to 4 [nm] or less.

While a case where the first switch transistor 18a, the first memory transistor 19a, the second switch transistor 18b, and the second memory transistor 19b constituting the non-volatile memory unit 16 are formed in the second semiconductor region ER2 of a P-type conductivity, and the first access transistor 21a, the second access transistor 21b, the first drive transistor 23a, and the second drive transistor 23b constituting the SRAM 15 are formed in the second semiconductor region ER2 of a P-type conductivity has been described in the above described embodiments, the present invention is not limited to this. The first switch transistor 18a, the first memory transistor 19a, the second switch transistor 18b, and the second memory transistor 19b constituting the non-volatile memory unit 16 may be formed in a first semiconductor region ER1 of an N-type conductivity. In the case, the area of the non-volatile SRAM memory cell can be reduced because the non-volatile memory unit can be formed in the same first semiconductor region ER1 as that in the first load transistor and she second load transistor in the SRAM.

REFERENCE SIGNS LIST 1, 61 NON-VOLATILE SEMI CONDUCTOR MEMORY DEVICE
2, 55a, 85, 95 NON-VOLATILE SRAM MEMORY CELL4 DATA INVERSION CIRCUIT
5 BIT LINE CONTROL CIRCUIT
8 SRAM POWER SUPPLY CONTROL CIRCUIT

11 NON-VOLATILE MEMORY UNIT CONTROL CIRCUIT
15 SRAM
16 NON-VOLATILE MEMORY UNIT
17a FIRST MEMORY CELL
17b, 65, 68, 70 SECOND MEMORY CELL
18a, 87a. FIRST SWITCH TRANSISTOR.
18b, 87b SECOND SWITCH TRANSISTOR
19a FIRST MEMORY TRANSISTOR
19b SECOND MEMORY TRANSISTOR
BLT0, BLT1, BLT2, BLT3 COMPLEMENTARY FIRST BIT LINE
BLB0, BLB1, BLB2, BLB3 COMPLEMENTARY SECOND BIT LINE
21a FIRST ACCESS TRANSISTOR
21b SECOND ACCESS TRANSISTOR
22a FIRST LOAD TRANSISTOR
22b SECOND LOAD TRANSISTOR
23a FIRST DRIVE TRANSISTOR.
23b SECOND DRIVE TRANSISTOR
90 SWITCH MECHANISM
FGa, FGb FLOATING GATE (CHARGE STORAGE REGION)
VSp0, VSp1, VSp2, Vsp3 POWER SUPPLY LINE
VSn0, VSn1, VSn2, VSn3 REFERENCE VOLTAGE LINE

What is claimed is:

1. A non-volatile semiconductor memory device comprising a non-volatile static random access memory (SRAM) memory cell including
an SRAM including a first load transistor and a first drive transistor having their respective one ends connected to each other, a first storage node being provided between the first load transistor and the first drive transistor, a second load transistor and a second drive transistor having their respective one ends connected to each other, a second storage node being provided between the second load transistor and the second drive transistor, a power supply line being connected to respective other ends of the first load transistor and the second load transistor, and a reference voltage line being connected to respective other ends of the first drive transistor and the second drive transistor, and
a non-volatile memory unit including a first memory cell having a first memory transistor and a first switch transistor connected in series with the first memory transistor in which a voltage is applied to one end of the first switch transistor from one of the first storage node and the second storage node and a second memory cell having a second memory transistor and a second switch transistor connected in series with the second memory transistor in which a voltage is applied to one end of the second switch transistor from the other one of the second storage node and the first storage node,
the SRAM further including
a first access transistor having one end connected to respective gates of the second load transistor and the second drive transistor and the first storage node, the other end connected to a complementary first bit line, and a gate connected to a word line, and
a second access transistor having one end connected to respective gates of the first load transistor and the first drive transistor and the second storage node, the other end connected to a complementary second bit line, and a gate connected to the word line, and
a thickness of a gate insulating film of each of the first access transistor, the second access transistor, the first load transistor, the second load transistor, the first drive transistor, and the second drive transistor is set to 4 [nm] or less.

2. The non-volatile semiconductor memory device according to claim 1, wherein
one of the first switch transistor and the second switch transistor is turned on due to a difference between respective voltages at the first storage node and the second storage node, and
data writing to the first memory transistor or the second memory transistor and inhibition of the data writing to the first memory transistor or the second memory transistor are determined by turning on or off the first switch transistor and the second switch transistor.

3. The non-volatile semiconductor memory device according to claim 1,
wherein a thickness of the gate insulating film of each of the first switch transistor and the second switch transistor in the non-volatile memory unit is set to 4 [nm] or less.

4. The non-volatile semiconductor memory device according to claim 1, wherein
the first storage node is connected to the one end of the first switch transistor, and a voltage at the first storage node is applied thereto, and
the second storage node is connected to the one end of the second switch transistor, and a voltage at the second storage node is applied thereto.

5. The non-volatile semiconductor memory device according to claim 1, further comprising
a first reading transistor having one end connected to the first storage node and the other end connected to the first memory transistor, and
a second reading transistor having one end connected to the second storage node and the other end connected to the second memory transistor,
wherein the second storage node is connected to one end of the first switch transistor, and a voltage at the second storage node is applied thereto, and
the first storage node is connected to one end of the second switch transistor, and a voltage at the first storage node is applied thereto.

6. The non-volatile semiconductor memory device according to claim 1,
further comprising a switch mechanism connected to the SRAM and the non-volatile memory unit,
wherein the switch mechanism selectively connects one of the first storage node and the second storage node to the first switch transistor and selectively connects the other of the second storage node and the first storage node to the second switch transistor.

7. The non-volatile semiconductor memory device according to claim 1, wherein
in the non-volatile SRAM memory cell, a plurality of the non-volatile memory units are connected in parallel with one SRAM.

8. The non-volatile semiconductor memory device according to claim 1, further comprising
a first semiconductor region where the first load transistor and the second load transistor constituting the SRAM are formed, and
a second semiconductor region where the first access transistor, the second access transistor, the first drive transistor, and the second drive transistor constituting the SRAM are formed,
wherein the first switch transistor, the first memory transistor, the second switch transistor, and the second memory transistor constituting the non-volatile memory unit are formed in one of the first semiconductor region and the second semiconductor region.

9. The non-volatile semiconductor memory device according to claim 1, wherein
in the non-volatile memory unit, a first switch gate line is connected to the gate of the first switch transistor while a second switch gate line different from the first switch gate line is connected to the gate of the second switch transistor, and the first switch transistor and the second switch transistor are independently turned on or off.

10. The non-volatile semiconductor memory device according to claim 1, further comprising
a data inversion circuit that detects a voltage at the first storage node and/or a voltage at the second storage node via the complementary first bit line and the complementary second bit line, and then applies, to the first storage node or the second storage node to which a High-level voltage is applied, a Low-level voltage obtained by logically inverting the High-level voltage while applying, to the second storage node or the first storage node to which a Low-level voltage is applied, a High-level voltage obtained by logically inverting the low-level voltage, and
the SRAM applies the Low-level and High-level voltages obtained by the logical inversion based on the data inversion circuit when SRAM data is programmed into the non-volatile memory unit from the first storage node and the second storage node, and injects charge into a charge storage region of one of the first memory transistor and the second memory transistor.

11. The non-volatile semiconductor memory device according to claim 1, further comprising
a data inversion circuit that detects a voltage at the first storage node and/or a voltage at the second storage node via the complementary first bit line and the complementary second bit line, and then applies, to the first storage node or the second storage node to which a High-level voltage is applied, a Low-level voltage obtained by logically inverting the High-level voltage while applying, to the second storage node or the first storage node to which a Low-level voltage is applied, a High-level voltage obtained by logically inverting the Low-level voltage, and
the SRAM applies the Low-level and High-level voltages, respectively, to the first storage node and the second storage node based on the presence or absence of injection of charge in respective charge storage regions of the first memory transistor and the second memory transistor in the non-volatile memory unit when memory data stored in the non-volatile memory unit is written into the SRAM, and then applies the High-level and Low-level voltages obtained from the logical inversion by the data inversion circuit to the first storage node and the second storage node.

12. The non-volatile semiconductor memory device according to claim 1, further comprising
an SRAM power supply control circuit that applies a power supply voltage to the power supply line,
wherein the SRAM power supply control circuit stops applying voltage to the power supply line when memory data stored in the non-volatile memory unit is written into the SRAM, to turn off the first load transistor and the second load transistor.

13. The non-volatile semiconductor memory device according to claim 9, further comprising
a bit line control circuit that supplies a reference current to one of the complementary first bit line and the complementary second bit line, and
a non-volatile memory unit control circuit that turns on the first switch transistor and applies a predetermined measurement voltage to the gate of the first memory transistor when the reference current is supplied to the first storage node, and turns on the second switch transistor and applies a predetermined measurement voltage to the gate of the second memory transistor when the reference current is supplied to the second storage node,
wherein the first storage node and the second storage node are latched to a Low-level voltage with the memory current when a memory current flowing through the first memory transistor or the second memory transistor with the measurement voltage is smaller than the reference current, and are latched to a High-level voltage with the reference current when the memory current is larger than the reference current.

14. The non-volatile semiconductor memory device according to claim 1, wherein
a plurality of the non-volatile SRAM memory cells are arranged in a matrix shape, and
a predetermined voltage is collectively applied to memory gate lines or memory source lines respectively connected to the plurality of non-volatile SRAM memory cells for each direction.

15. The non-volatile semiconductor memory device according to claim 7, wherein
the non-volatile SRAM memory cell turns off, when SRAM data is programmed into one of the plurality of non-volatile memory units from the SRAM, the first switch transistor and the second switch transistor in the other non-volatile memory unit, while ejecting charge stored in a charge storage region of one of the first memory transistor and the second memory transistor in the other non-volatile memory unit associated with the non-volatile memory unit into which the SRAM data is programmed.

* * * * *